(12) United States Patent
Chao et al.

(10) Patent No.: US 12,538,776 B2
(45) Date of Patent: Jan. 27, 2026

(54) METHODS FOR SELECTIVELY REMOVING MATERIAL

(71) Applicant: Taiwan Semiconductor Manufacturing Company, Ltd., Hsinchu (TW)

(72) Inventors: Yi-Hsiang Chao, Taipei (TW); Shu-Lan Chang, Hsinchu (TW); Ching-Yi Chen, Hsinchu (TW); Shih-Wei Yeh, Hsinchu (TW); Pei Shan Chang, Taipei (TW); Ya-Yi Cheng, Taichung (TW); Yu-Chen Ko, Chiayi (TW); Yu-Shiuan Wang, Taipei (TW); Chun-Hsien Huang, Hsinchu (TW); Hung-Chang Hsu, Kaohsiung (TW); Chih-Wei Chang, Hsin-Chu (TW); Ming-Hsing Tsai, Chu-Pei (TW); Wei-Jung Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 800 days.

(21) Appl. No.: 17/804,957

(22) Filed: Jun. 1, 2022

(65) Prior Publication Data
US 2023/0395426 A1 Dec. 7, 2023

(51) Int. Cl.
*H01L 21/768* (2006.01)
*H01L 21/02* (2006.01)
(Continued)

(52) U.S. Cl.
CPC .. *H01L 21/76814* (2013.01); *H01L 21/02063* (2013.01); *H01L 21/76805* (2013.01);
(Continued)

(58) Field of Classification Search
CPC ......... H01L 21/76814; H01L 21/02063; H01L 21/76805; H01L 21/76895;
(Continued)

(56) References Cited

U.S. PATENT DOCUMENTS 7,341,945 B2  3/2008 Yamamoto
9,899,258 B1* 2/2018 Wu .................. H01L 21/76843
(Continued)

FOREIGN PATENT DOCUMENTS

TW  200304204 A  9/2003
TW  202022992 A  6/2020

*Primary Examiner* — Norman D Richards
*Assistant Examiner* — Laura M Dykes
(74) *Attorney, Agent, or Firm* — Ingrassia Fisher & Lorenz, LLP

(57) ABSTRACT

Provided is a conductive structure and a method for forming such a structure. The method includes forming a treatable layer by depositing a layer comprising a metal over a structure; performing a directional treatment process on a targeted portion of the treatable layer to convert the targeted portion to a material different from a non-targeted portion of the treatable layer, wherein the directional treatment process is selected from the group consisting of nitridation, oxidation, chlorination, carbonization; and selectively removing the non-targeted portion from the structure, wherein the targeted portion remains over the structure.

20 Claims, 20 Drawing Sheets

(51) Int. Cl.
*H01L 23/532* (2006.01)
*H01L 23/535* (2006.01)

(52) U.S. Cl.
CPC .. *H01L 21/76895* (2013.01); *H01L 23/53266* (2013.01); *H01L 23/535* (2013.01)

(58) Field of Classification Search
CPC ............. H01L 23/53266; H01L 23/535; H01L 21/76865; H01L 21/76877; H01L 21/76843; H01L 21/28518
USPC ........................................................ 257/751
See application file for complete search history.

(56) References Cited

U.S. PATENT DOCUMENTS

| | | |
|---|---|---|
| 11,222,946 B2 | 1/2022 | Yin et al. |
| 2001/0033023 A1* | 10/2001 | Suguro ............. H01L 21/76841 257/770 |
| 2011/0263079 A1* | 10/2011 | Wang ................ H01L 21/76888 438/149 |
| 2017/0053864 A1* | 2/2017 | Peng ...................... H01L 23/528 |
| 2018/0033687 A1 | 2/2018 | Hung et al. |
| 2019/0273147 A1* | 9/2019 | Cheng ............... H01L 21/76826 |
| 2021/0407862 A1* | 12/2021 | More ................ H10D 84/0177 |
| 2023/0223302 A1* | 7/2023 | Chen ................ H01L 21/76805 257/384 |

* cited by examiner

METHODS FOR SELECTIVELY REMOVING MATERIAL

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It should be noted that, in accordance with the standard practice in the industry, various features may not be drawn to scale. In fact, the dimensions of the various features may be arbitrarily increased or reduced for clarity of discussion.

FIGS. 23A and 23B through 30A and 30B are cross sectional views illustrating stages of fabrication of the conductive structure of FIG. 4 according to the method of FIG. 22 in accordance with some embodiments.

DETAILED DESCRIPTION

Figure 1:
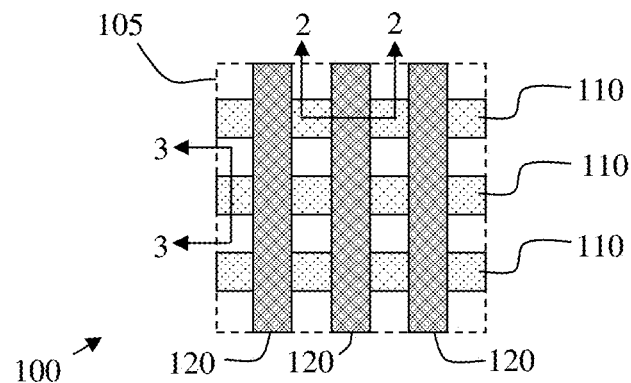
FIG. 1 is an overhead view of a portion of a semiconductor device according to various aspects of the present disclosure.

The following disclosure provides many different embodiments, or examples, for implementing different features of the subject matter provided. Specific examples of components and arrangements are described below to simplify the present disclosure. These are, of course, merely examples and are not intended to be limiting.

For the sake of brevity, conventional techniques related to conventional semiconductor device fabrication may not be described in detail herein. Moreover, the various tasks and processes described herein may be incorporated into a more comprehensive procedure or process having additional functionality not described in detail herein. In particular, various processes in the fabrication of semiconductor devices are well-known and so, in the interest of brevity, many conventional processes will only be mentioned briefly herein or will be omitted entirely without providing the well-known process details. As will be readily apparent to those skilled in the art upon a complete reading of the disclosure, the structures disclosed herein may be employed with a variety of technologies, and may be incorporated into a variety of semiconductor devices and products. Further, it is noted that semiconductor device structures include a varying number of components and that single components shown in the illustrations may be representative of multiple components.

Furthermore, spatially relative terms, such as "over", "overlying", "above", "upper", "top", "under", "underlying", "below", "lower", "bottom", and the like, may be used herein for ease of description to describe one element's or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. When a spatially relative term, such as those listed above, is used to describe a first element with respect to a second element, the first element may be directly on the other element, or intervening elements or layers may be present. When an element or layer is referred to as being "on" another element or layer, it is directly on and in contact with the other element or layer.

As used herein, a "material layer" is a layer that includes at least 50 wt. % of the identified material, for example at least 60 wt. % of the identified material, or at least 75 wt. % of the identified material. Likewise, a layer that is a "material" includes at least 50 wt. % of the identified material, for example at least 60 wt. % of the identified material, or at least 75 wt. % of the identified material. For example, each of a titanium nitride layer and a layer that is titanium nitride is a layer that is at least 50 wt. %, at least 60 wt. %, or at least 75 wt. %, titanium nitride.

In addition, the present disclosure may repeat reference numerals and/or letters in the various examples. This repetition is for the purpose of simplicity and clarity and does not in itself dictate a relationship between the various embodiments and/or configurations discussed.

Various embodiments are discussed herein in a particular context, namely, forming a FinFET transistor. However, various embodiments may be applied to other semiconductor devices/processes, such as planar transistors, and the like. Further, some embodiments discussed herein are discussed in the context of devices formed using a gate-last process. In other embodiments, a gate-first process may be used.

Various embodiments provide a semiconductor device and methods of forming a semiconductor device. In certain embodiments, a conductive structure is formed in a cavity over an underlying structure to provide for electrical connection between the conductive structure and the underlying structure.

Formation of the conductive structure in the cavity may be facilitated by removing layers from the cavity sidewalls, such as to reduce the aspect ratio of the cavity. Removal of layers from cavity sidewalls may allow for the filling of the cavity by conductive material while avoiding or reducing the formation of voids. Such voids would increase the resistance of the conductive structure, and a conductive structure that contains one or more voids may experience a degradation of performance.

Further, in certain embodiments, conversion of a portion of a material with a first etch rate to a replacement material having a second etch rate different from the first etch rate (for a selected etchant) allows for the etch process to selectively remove layers from the cavity sidewalls without damaging the underlying structure or layers thereon.

While the Figures illustrate various embodiments of a semiconductor device, additional features may be added in the semiconductor device depicted in the Figures and some of the features described below can be replaced, modified, or eliminated in other embodiments of the semiconductor device.

Referring now to the Figures, FIG. 1 provides an overhead view of a portion of a semiconductor device 100. The exemplary semiconductor device 100 is a FinFET device and includes a substrate 105 and fin structures 110 protruding above the substrate 105. As shown, the fin structures 110 are spaced apart from one another in a Y-direction and extend parallel to one another in an X-direction. As further shown, gate structures 120 are formed over the fin structures 110. The gate structures 120 are spaced apart from one another in the X-direction and extend parallel to one another in the Y-direction.

Figure 2:
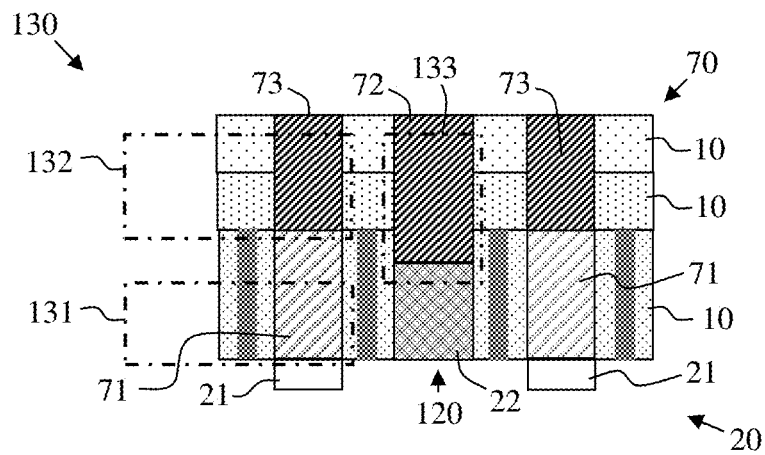
FIG. 2 is a cross-sectional view of the semiconductor device take along line 2-2 in FIG. 1 in accordance with some embodiments.
Figure 3:
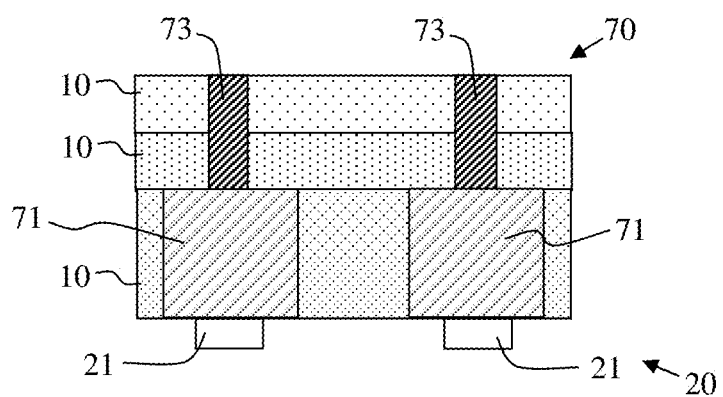
FIG. 3 is a cross-sectional view of the semiconductor device take along line 3-3 in FIG. 1 in accordance with some embodiments.

FIG. 2 provides a cross-sectional schematic view of the device 100 of FIG. 1, taken along line 2-2 in FIG. 1. FIG. 3 provides a cross-sectional schematic view of the device 100 of FIG. 1, taken along line 3-3 in FIG. 1.

As shown in FIG. 2, the device 100 includes source/drain regions 21 that are formed in the fin structure on opposing sides of the gate structure 120. In exemplary embodiments, the source/drain regions 21 are formed from epitaxial material.

Layers of dielectric material 10 are formed over the source/drain regions 21. Exemplary dielectric material includes silicon oxide and silicon nitride or the like.

As shown, the gate structure 120 is formed in the layer of dielectric material 10 directly over the source/drain regions 21. An exemplary gate structure 120 includes a conductive gate 22, such as a metal gate.

Further, conductive plugs 71 are formed in the layer of dielectric material 10 directly over the source/drain regions 21 and are electrically connected to the source/drain regions 21. As further shown, a conductive plug 72 is formed over, and is electrically connected to, the conductive gate 22. The exemplary conductive plug 72 passes through several layers of dielectric material 10. Also, conductive plugs 73 are formed over, and are electrically connected to, the conductive plugs 71 that contact the source/drain regions 21.

In FIGS. 2 and 3, reference number 20 refers to an underlying structure over which a conductive plug may be formed for electrical contact therebetween. Therefore, underlying structure 20 may include source/drain regions 21, conductive gate 22, and conductive plugs 71.

Likewise, in FIGS. 2 and 3, reference number 70 refers to a conductive structure that is formed over an underlying structure 20 for electrical connection therebetween. Therefore, conductive structures 70 may include conductive plug 71, conductive plug 72, or conductive plug 73.

Embodiments herein provide for conductive structures 70 having reduced resistance. Certain embodiments address the formation of conductive structures 71 over source/drain regions 21, conductive structures 72 over conductive gates 22, and/or conductive structures 73 over conductive plugs 71.

As seen in FIG. 2, embodiments may be described herein relating to three different applications. In other words, three different interconnections 130 are contemplated herein between underlying structures 20 and overlying structures 70. For example, interconnection 131 is formed between source/drain region 21 and conductive plug 71, interconnection 132 is formed between conductive plug 71 and conductive structure 73, and interconnection 133 is formed between gate structure 120 and conductive structure 72.

Regardless of the embodiment, the conductive structures 70 are formed by common operations. For example, a treatable layer of a first material may be formed over the underlying structure 20. Then, a directional treatment process may be performed on a targeted portion of the treatable layer to convert the targeted portion to a second material different from the first material. Thereafter, the first material may be removed by an etch process selective to removal of the first material as compared to the second material. As a result, the second material remains overlying and protecting the underlying structure 20. Thereafter, a conductive material, such as a metal, for example tungsten (W) is deposited over the second material overlying the underlying structure 20. The conductive material and second material may be considered to form the conductive structure 70.

Figure 4:
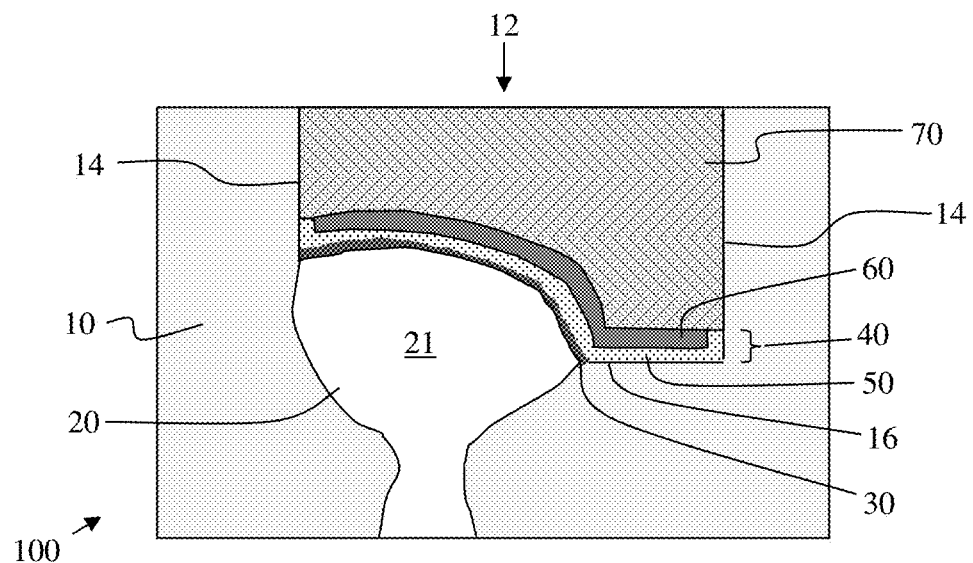
FIG. 4 is a cross-sectional view of an interconnection between an underlying structure and a conductive structure of FIG. 2 in accordance with some embodiments.
Figure 5:
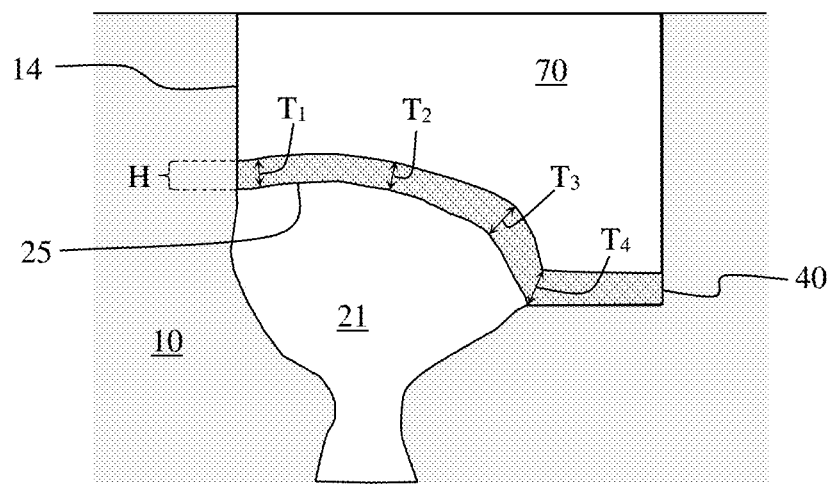
FIG. 5 is a simplified cross-sectional view of the interconnection of FIG. 4 in accordance with some embodiments.
Figure 6:
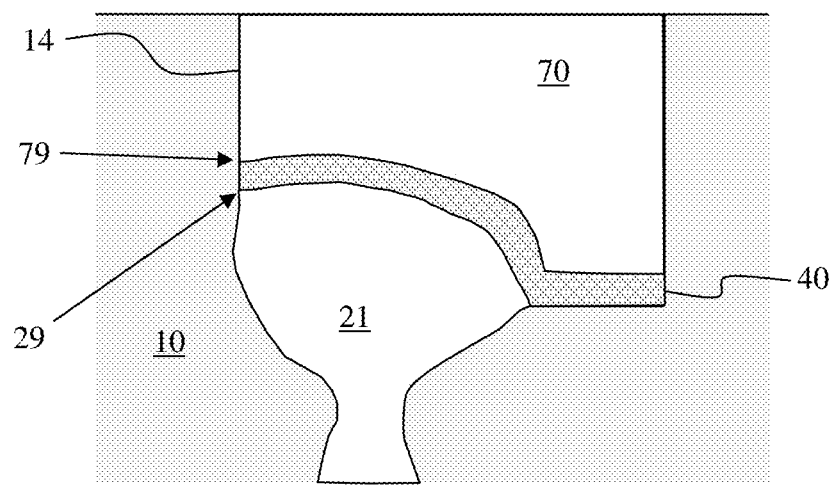
FIG. 6 is a simplified cross-sectional view of the interconnection of FIG. 4 in accordance with some embodiments.
Figure 7:
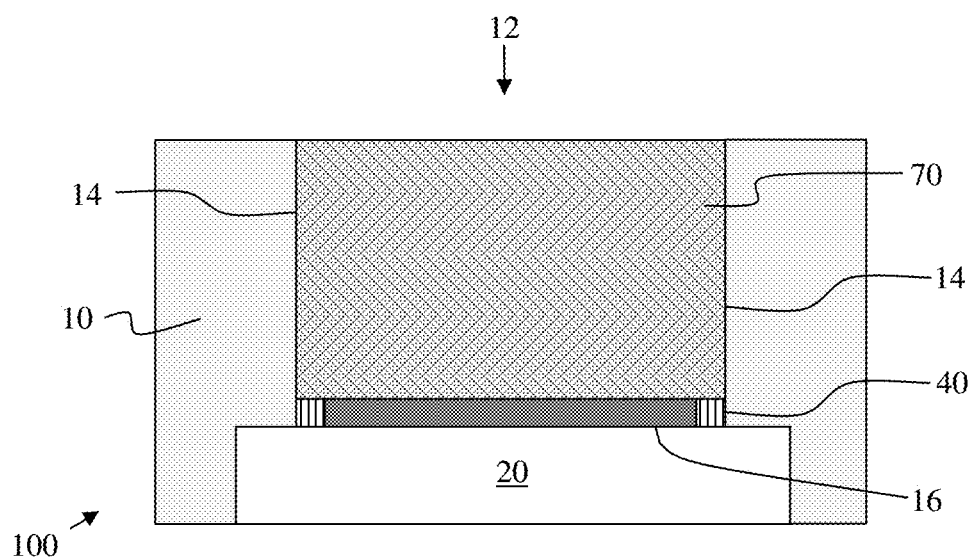
FIG. 7 is a cross-sectional view of an interconnection between an underlying structure and a conductive structure of FIG. 2 in accordance with some embodiments.
Figure 8:
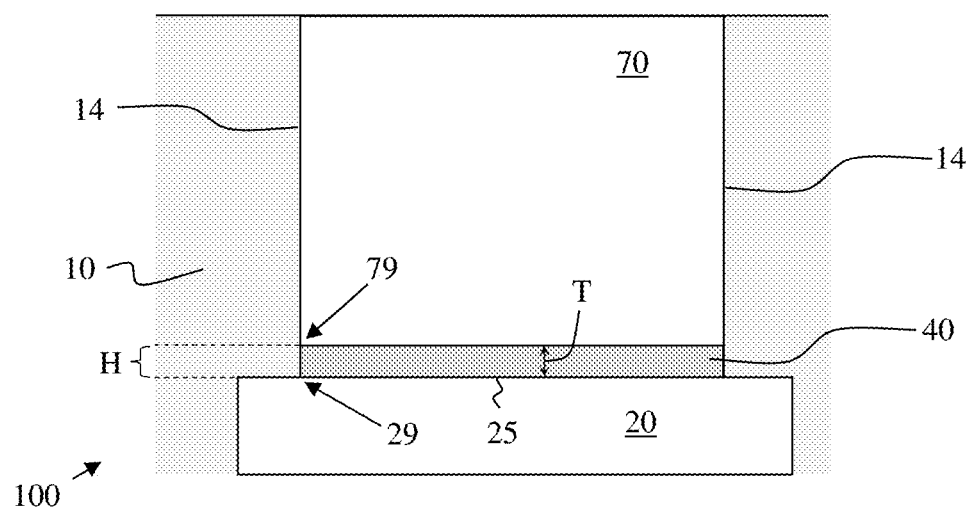
FIG. 8 is a simplified cross-sectional view of the interconnection of FIG. 7 in accordance with some embodiments.

FIGS. 4-6 and 7-8 illustrate portions of a semiconductor device 100 including exemplary embodiments of conductive structures 70. In FIGS. 4-6, the conductive structure 70 lies over and is in electrical contact with a source/drain region 21. In FIGS. 7-8, the conductive structure 70 lies over and is in electrical contact with an underlying structure 20 in the form of a conductive gate 22 or a conductive plug 71.

Referring to FIG. 4, the underlying structure 20 is a source/drain region 21, such an epitaxial source/drain region 21. As shown, the source/drain region 21 is embedded in dielectric material 10. The exemplary dielectric material 10 includes a cavity 12 delineated by sidewalls 14 of the dielectric material 10 and a bottom 16. As shown, the bottom 16 of the cavity 12 is at least partially formed by the source/drain region 21, such that the source/drain region 21 borders the bottom 16 of the cavity 12. Cavity bottom 16 may be partially formed by the source/drain region 21 and partially formed by the dielectric material 10.

In exemplary embodiments, the source/drain region 21 is silicided such that the source/drain region 21 includes a silicide layer 30, for example a layer of titanium silicide (TiSi).

As further shown, a layer 40 is located in the cavity 12 and located directly on the source/drain region 21. Layer 40 may include sublayers. In exemplary embodiments, the layer 40 includes a barrier metal.

In exemplary embodiments, layer 40 includes a first sublayer or first layer 50 and a second sublayer or second layer 60. An exemplary first sublayer 50 is a titanium silicon nitride ($TiSi_xN_y$). In an exemplary embodiment, the first sublayer 50 extends continuously from sidewall 14 to sidewall 14, completely covering the bottom 16 of the cavity 12. An exemplary second sublayer 60 is titanium nitride (TiN), such as PVD titanium nitride. In the illustrated embodiment, the second sublayer 60 is separated from the sidewalls 14 of the cavity 12 by the first sublayer 50, such that the second sublayer 60 does not contact the sidewalls 14 of the cavity 12.

As further shown, conductive structure 70, or conductive plug, is located over the layer 60. Specifically, the conductive structure fills the cavity 12 and contacts the sidewalls 14, the first sublayer 50, and the second sublayer 60. In other words, the conductive structure is in the cavity and is located directly on the layer 60 and directly on the sidewalls 14 of the dielectric material 10. In exemplary embodiments, the conductive structure 70 is tungsten.

In FIGS. 5 and 6, source/drain region 21 is shown as a single entity including the silicide layer, and layer 40 is shown as a single entity without delineation of sublayers 50 and for ease of discussion.

In FIG. 5, the layer 40 contacts the source/drain region 21 along a contact line 25. FIG. 5 illustrates that layer 40 has a minimum thickness ($T_x$) separating the conductive structure 70 from each point along the contact line 25. In other words, a minimum thickness ($T_x$) of the layer 40 is defined at every point along the contact line 25 as the smallest distance to the conductive structure 70. In FIG. 5, thicknesses $T_1$, $T_2$, $T_3$, and $T_4$ are expressly illustrated. An average minimum thickness (T) can be calculated from the minimum thicknesses of the layer 40 from every point along the contact line 25.

As further shown in FIG. 5, the layer 40 has a height (H) in contact with the sidewall or sidewalls 14. In some embodiments, the height (H) is a vertical height, i.e., in the Z-direction. In exemplary embodiments, the height (H) is less than five times the average minimum thickness (H<5T). For example the height (H) is less than four times the average minimum thickness (H<4T), the height (H) is less than three times the average minimum thickness (H<3T), the height (H) is less than two times the average minimum thickness (H<2T), or the height (H) is less than one and one half times the average minimum thickness (H<1.5T).

FIG. 6 illustrates that an interface 29 is defined where the source/drain region 21, layer 40, and the sidewall 14 are in contact. Further, FIG. 6 illustrates that a contact edge 79 of the conductive structure 70 is in contact with the sidewall 14. In exemplary embodiments, a minimum distance between the conductive structure 70 and the interface 29 is located from the contact edge 79 of the conductive structure 70 to the interface 29.

In FIG. 6, the exemplary conductive structure 70 has a width 13 in the Y-direction of from 20 to 300 nm or from 500 to 1500 nm depending on the use of the conductive structure 70, and a height 15 in the Z-direction of from about 30 to about 150 nm. An exemplary conductive structure 70 may have a length or depth in the X-direction (not shown) of from about 10 to about 40 nm.

Referring to FIG. 7, the underlying structure 20 may be a conductive gate or a conductive structure such as a conductive via. As shown, the underlying structure 20 is embedded in dielectric material 10. The exemplary dielectric material 10 includes a cavity 12 delineated by sidewalls 14 of the dielectric material 10 and a bottom 16. As shown, the bottom 16 of the cavity 12 is at least partially formed by the underlying structure 20, such that the underlying structure 20 borders the bottom 16 of the cavity 12. In the embodiment of FIG. 7, the cavity bottom 16 is formed entirely by the underlying structure 20.

As further shown, a layer 40 is located in the cavity 12 and located directly on the underlying structure 20. The layer 40 may include sublayers. In exemplary embodiments, the layer 40 includes a barrier metal. An exemplary layer 40 is titanium nitride (TiN), such as PVD titanium nitride.

As further shown, conductive structure 70, or conductive plug, is located over the layer 40. Specifically, the conductive structure fills the cavity 12 and contacts the sidewalls 14 and layer 40. In other words, the conductive structure 70 is in the cavity and is located directly on layer 40 and directly on the sidewalls 14 of the dielectric material 10. In exemplary embodiments, the conductive structure is tungsten.

FIG. 8 illustrates that the layer 40 contacts the underlying structure 20 along a contact line 25. FIG. 8 further illustrates that layer 40 has a minimum thickness separating the conductive structure 70 from each point along the contact line 25. In other words, a minimum thickness ($T_x$) of the layer 40 is defined at every point along the contact line 25 as the smallest distance to the conductive structure 70. An average minimum thickness (T) can be calculated from the minimum thicknesses of the layer 40 from every point along the contact line 25.

As further shown in FIG. 8, the layer 40 has a height (H) in contact with the sidewall or sidewalls 14. In some embodiments, the height (H) is a vertical height, i.e., in the Z-direction. In exemplary embodiments, the height (H) is less than five times the average minimum thickness (H<5T). For example the height (H) is less than four times the average minimum thickness (H<4T), the height (H) is less than three times the average minimum thickness (H<3T), the height (H) is less than two times the average minimum thickness (H<2T), or the height (H) is less than one and one half times the average minimum thickness (H<1.5T).

FIG. 8 illustrates that an interface 29 is defined where the underlying structure 20, layer 40, and the sidewall 14 are in contact. Further, FIG. 6 illustrates that a contact edge 79 of the conductive structure 70 is in contact with the sidewall 14. In exemplary embodiments, a minimum distance between the conductive structure 70 and the interface 29 is located from the contact edge 79 of the conductive structure 70 to the interface 29.

In FIG. 8, the exemplary conductive structure 70 has a width 13 in the Y-direction of from 10 to 75 nm and a height 15 in the Z-direction of from about 30 to about 150 nm. An exemplary conductive structure 70 may have a length or depth in the X-direction (not shown) of from about 10 to about 25 nm.

Figure 9:
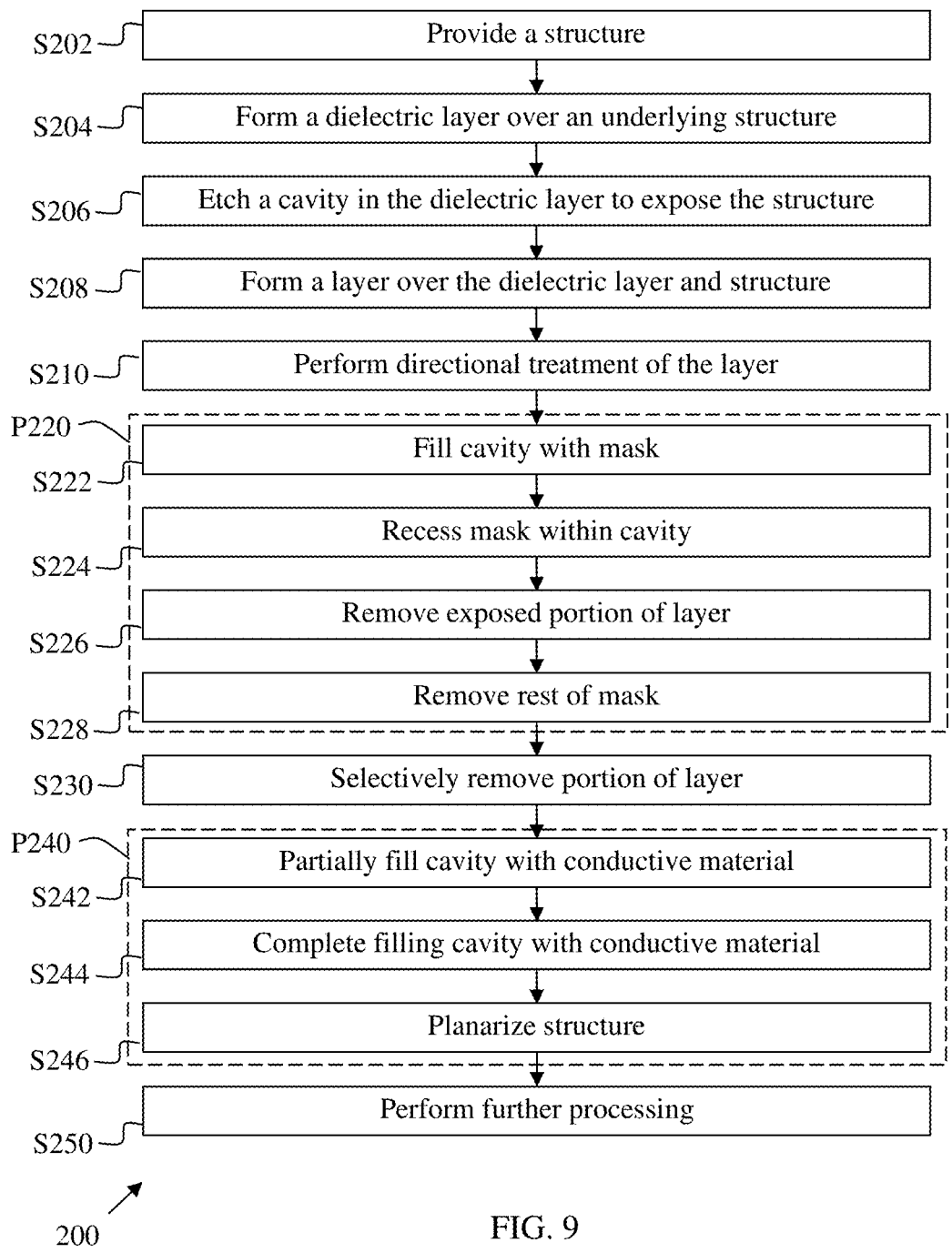
FIG. 9 is a flow chart illustrating a method for forming the structure of FIG. 7 in accordance with some embodiments.

FIG. 9 is a flow chart of a method 200 for forming a structure 70, according to various aspects of the present disclosure. FIG. 9 is described in conjunction with FIGS. 10-21 which illustrate a semiconductor device 100 at various stages of fabrication in accordance with some embodiments of the present disclosure of the method 200. The method 200 is merely an example, and is not intended to limit the present disclosure beyond what is explicitly recited in the claims. Additional steps may be provided before, during, and after method 200, and some of the steps described can be moved, replaced, or eliminated for additional embodiments of method 200. Additional features may be added in the semiconductor device depicted in the Figures and some of the features described below can be replaced, modified, or eliminated in other embodiments of the semiconductor device.

As with the other method embodiments and exemplary devices discussed herein, it is understood that parts of the semiconductor device 100 may be fabricated by typical semiconductor technology process flow, and thus some processes are only briefly described herein. Further, the exemplary semiconductor devices may include various other devices and features, such as other types of devices such as additional transistors, bipolar junction transistors, resistors, capacitors, inductors, diodes, fuses, and/or other logic devices, etc., but is simplified for a better understanding of concepts of the present disclosure. In some embodiments, the exemplary devices include a plurality of semiconductor devices (e.g., transistors), including PPETs, NFETs, etc., which may be interconnected. Moreover, it is noted that the process steps of methods 200 and 300, including any descriptions given with reference to the Figures, as with the remainder of the method and exemplary figures provided in this disclosure, are merely exemplary and are not intended to be limiting beyond what is specifically recited in the claims that follow.

Figure 10:
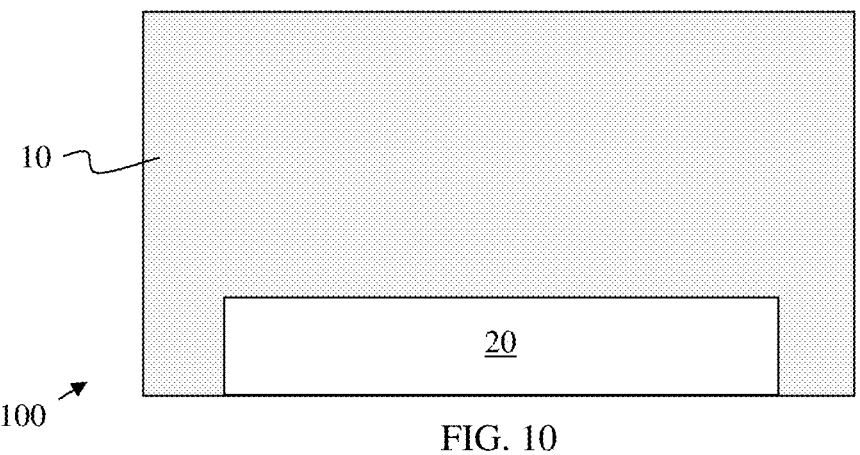
FIGS. 10-21 are cross sectional views illustrating stages of fabrication of the conductive structure of FIG. 7 according to the method of FIG. 9 in accordance with some embodiments.

At operation S202, the method 200 (FIG. 9) provides a structure 20, as shown in FIG. 10. In some embodiments, the structure 20 is a conductive structure like a conductive gate or conductive via or the like.

At operation S204, the method 200 forms a dielectric material 10 over the structure as shown in FIG. 10. In exemplary embodiments, the structure 20 is completely covered by the dielectric material 10.

Figure 11:
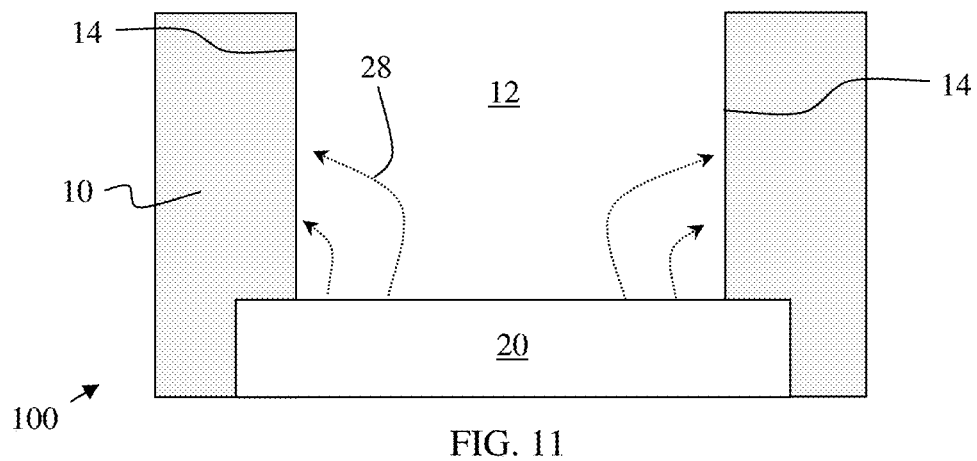

At operation S206, the method 200 includes etching a cavity 12, or contact opening, into the dielectric material 10, as shown in FIG. 11. For example, typical photolithography techniques may be used, including depositing and patterning a mask over the dielectric material 10 before the dielectric material 10 is etched. The sidewalls 14 formed by the formation of the cavity 12 may be vertical or inclined. For example, the sidewalls 14 may be parallel to the vertical Z-axis that is perpendicular to the X-axis and Y-axis, i.e., the sidewalls 14 form an internal angle of 0° with the vertical Z-axis. Alternatively, the sidewalls 14 may be inclined such that the width of the cavity increases when moving upward from the cavity bottom 16. Such sidewalls 14 may form an internal angle of less than 45° with the vertical Z-axis, such as less than 30° with the vertical Z-axis, less than 20° with the vertical Z-axis, less than 15° with the vertical Z-axis, less than 10° with the vertical Z-axis, or less than 5° with the vertical Z-axis.

As shown in FIG. 11, the etch process lands on the structure 20. In certain embodiments, the dielectric material 10 is etched via a dry etch process, such as with plasma. The etch process may cause residue, indicated by arrows 28, from the structure 20 to become located on the sidewalls 14.

Figure 12:
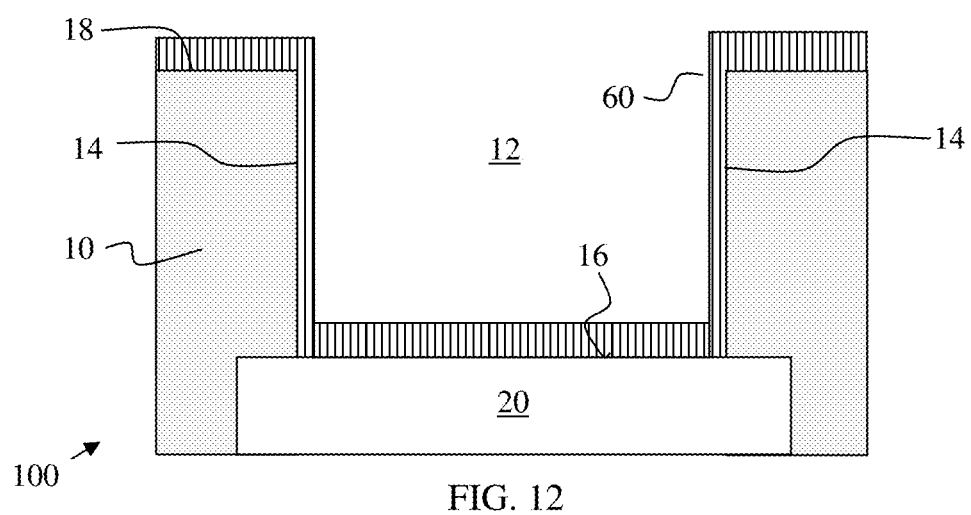

The method 200 may continue with operation S208 which includes forming a layer such as in the form of a treatable layer 60, over the dielectric material 10 and the structure as shown in FIG. 12. An exemplary embodiment forms the layer 60 conformally over the cavity sidewall 14 and the cavity bottom 16.

In exemplary embodiments, the layer 60 is directionally deposited, such that the layer 60 is formed with a greater thickness on the horizontal surfaces, i.e., the layer 60 has a greater thickness on the top surface 18 of the dielectric material 10 and on the cavity bottom 16 formed by the structure 20, as compared to the layer 60 formed on the non-horizontal sidewalls 14. In an exemplary embodiment, the thickness on horizontal surfaces is 40 Angstrom and the thickness on the sidewall is 10 Angstrom. In exemplary embodiments, the thickness on the horizontal surfaces is at least twice as great, at least three times as great, or at least four times as great as the thickness on the sidewall.

In an exemplary embodiment, the directional deposition process is a directional metal deposition process. In such embodiments, the layer is metal. In an exemplary embodiment, the layer is titanium.

The directional deposition process may be a plasma deposition process controlled by variables including metal target, flow rate, time, pressure and plasma type.

In an exemplary embodiment, the directional deposition process is a plasma reaction type, the plasma type is direct plasma, the target is titanium (though tungsten, cobalt and other suitable target metals may be used depending on the desired layer material), the process temperature is at about 250° C., the plasma power is from 100 to 5000 W (for ICP or CCP Plasma), and the pressure is from 500 to 30,000 mtorr. Other process conditions are contemplated.

Figure 13:
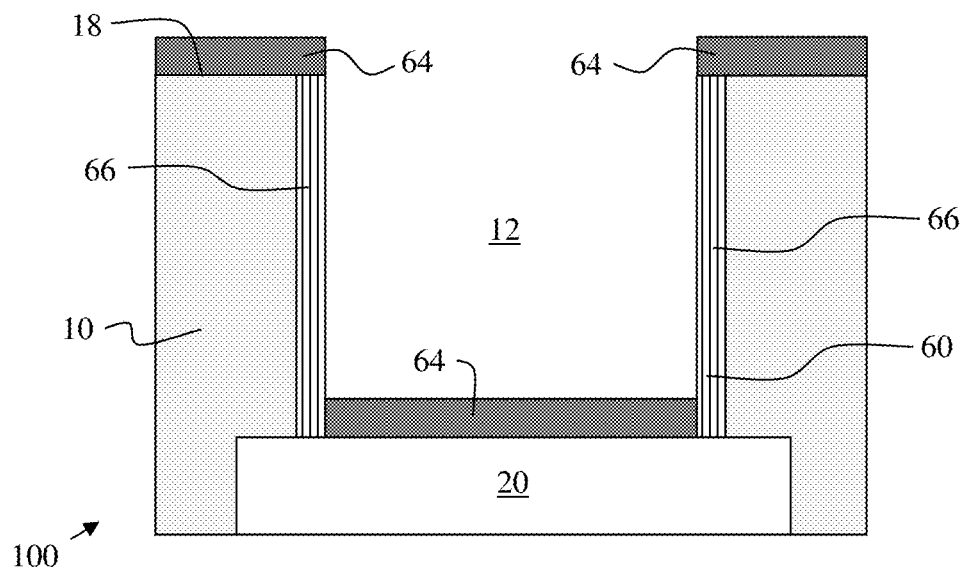

The method 200 may continue with operation S210 which includes performing a directional treatment process on the layer 60, as shown in FIG. 13. In exemplary embodiments, the directional treatment process converts the material of a targeted portion 64 of the layer 60 to a different material, while a non-targeted portion 66 of the layer 60 remains the same material. More specifically, the directional treatment process causes there to be an intrinsic difference between the materials of the targeted portion 64 and the non-targeted portion 66 such that one or the other may be selectively etched or otherwise removed.

In an exemplary embodiment, the directional treatment is nitridation, such as by a nitrogen plasma process. In other embodiments, the directional treatment is an oxidation, chlorination, carbonization, or other suitable process.

In certain embodiments, the directional treatment causes an increase in the thickness of the targeted portion 64 of the layer 60.

In an exemplary embodiment, the layer 60 as initially formed is titanium, the directional process is nitridation, the targeted portion 64 is converted to titanium nitride, and the non-targeted portion remains titanium.

The directional treatment may be controlled by variables including flow rate, time, and pressure.

In an exemplary embodiment, the directional treatment process is performed with a reaction chemical of $N_2$, $NH_3$, or $N_2H_4$, the inert chemical (carrier gas) is argon, the chemical flow rate is from 50 to 1000 sccm, the process temperature is from ambient (about 20° C.) to about 500° C., the reaction type is thermal (without plasma) or plasma, the plasma power, if used, is from 100 to 5000 W (for ICP or CCP Plasma), and the pressure is from 500 to 30,000 mtorr. Other process conditions are contemplated.

The directional treatment process may be used to enable a selective etch process to remove the non-targeted portion 66 of the layer 60 while the targeted portion 64 of the layer is not removed. For example, a ratio of the etch rate of non-targeted portion 66 to the etch rate of targeted portion 64 may be in the range of about five to about eight relative a same etch process.

As described below, the non-targeted portion 66 is removed. However, embodiments are contemplated in which the directional treatment process is used to enable a selective etch process to remove the targeted portion 64 of the layer 60 while the non-targeted portion 66 of the layer is not removed. For example, a ratio of the etch rate of targeted portion 64 to the etch rate of non-targeted portion 66 may be in the range of about five to about eight relative a same etch process.

As shown in FIG. 13, at the illustrated stage of fabrication, portion 64 of the layer 60 lies over, and directly on, the cavity bottom 16, and portion 66 of the layer 60 lies over, adjacent to, and directly on, the cavity sidewall 14.

The method 200 may continue with a process P220 for pulling back an upper portion of the layer 60 before the selective removal is performed.

Figure 14:
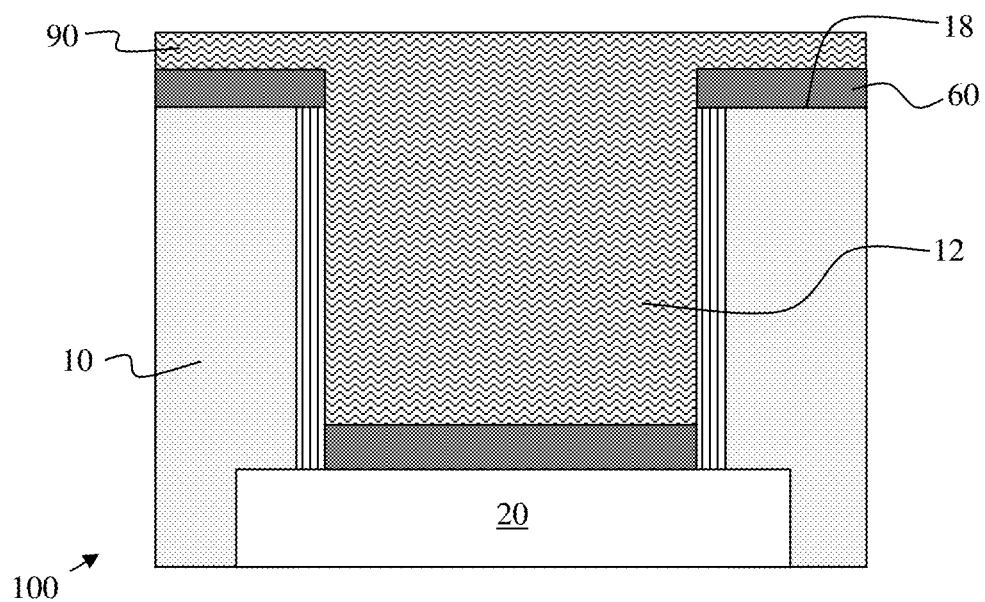

Process P220 include operation S222 which includes filling the cavity 12 with a mask layer 90 (e.g., a photoresist, a bottom anti-reflective coating layer (BARC) material, or the like) as shown in FIG. 14. The mask layer 90 may be deposited to overfill the cavity 12 such that the mask layer 90 extends above the cavity 12 and over the layer 60 on the top surface 18. The mask layer 90 may comprise any dielectric material having etch selectivity with the portions 64 and/or 66 of layer 60 relative a same etch process. For example, a ratio of the etch rate of mask layer 90 to the etch rate of portions of layer 60 may be in the range of about 5 to about 8 relative a same etch process. An exemplary BARC mask layer 90 may comprise silicon oxynitride or an organic thin film. In some embodiments, the BARC mask layer 90 is a polymer layer that is applied using a spin coating process.

Figure 15:
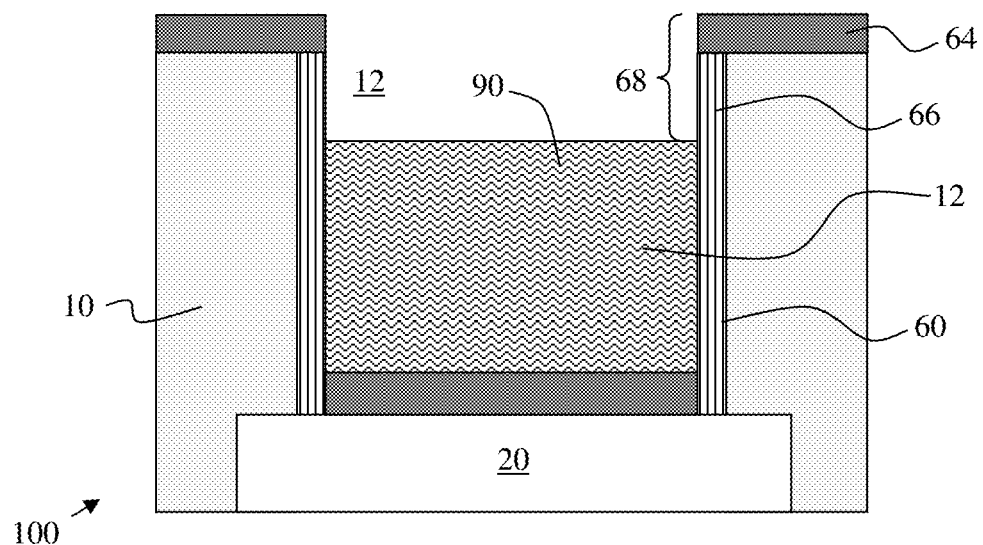

Process P220 includes operation S224 which includes recessing the mask layer 90 within the cavity 12, as shown in FIG. 15. As a result an upper portion 68 of the layer 60, including pieces of portion 64 and portion 66, is exposed.

Figure 16:
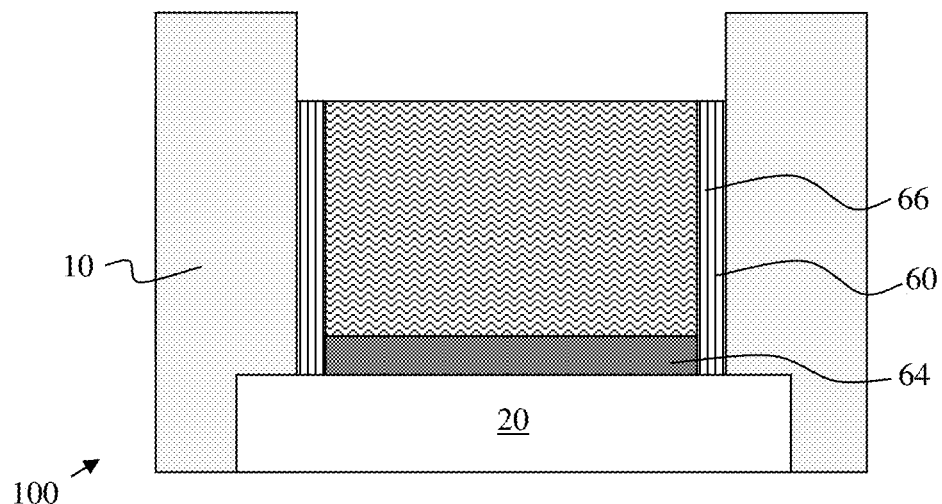

Further, process P220 includes operation S226 which includes removing the exposed upper portion 68 of the layer 60, as shown in FIG. 16. Operation S226 may include performing a wet etch.

Figure 17:
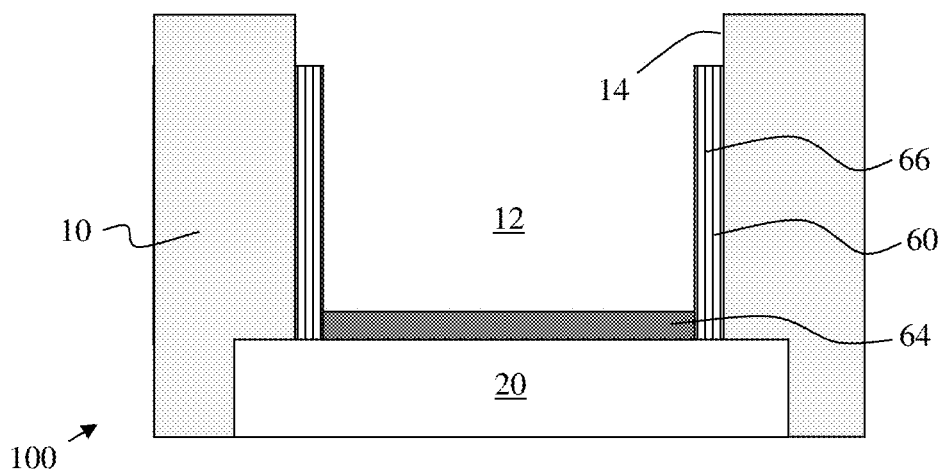

Process P220 also includes operation S228 which includes removing the remainder of the mask layer 90, as shown in FIG. 17. In an exemplary embodiment, operation S228 includes performing an ashing process to remove the mask layer 90.

In certain embodiments, process P220 may utilize $CF_4$, $H_2$, Ar, HCl, $DIO_3$, and $H_2SO_4$ among other chemistries to perform the removal operations.

As a result, at the stage of processing of the device 100 in FIG. 17, the cavity is bordered at an upper portion by the sidewalls 14 of dielectric material 10, by the non-targeted portions 66 along the sidewalls 14 therebelow, and by the targeted portion 64 lying over the underlying structure 20.

With process P220 completed, the method 200 may continue with operation S230 which includes selectively removing a portion of the layer 60. For example, operation S230 may selectively remove the non-targeted portion or the targeted portion from the structure, wherein the targeted portion or the non-targeted portion remains over the structure.

Figure 18:
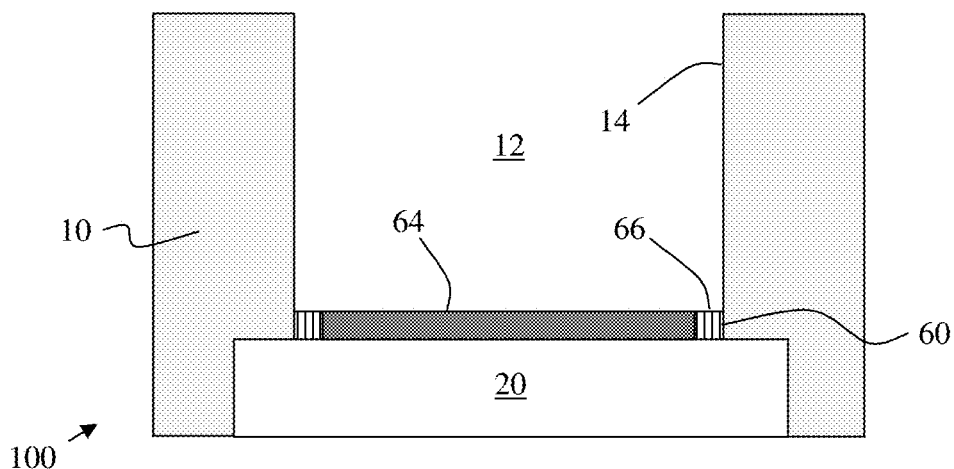

In the illustrated embodiment, operation S230 selectively removes the non-targeted portion 66 of the layer 60, as shown in FIG. 18. In certain embodiments, only the targeted portion 64 of the layer 60 remains. In such embodiments, the targeted portion 64 of the layer 60 extends from sidewall 14 to sidewall such that the underlying structure 20 is completely covered by the targeted portion 64 of the layer 60.

In other embodiments, and as illustrated in FIG. 18, a remainder of the non-targeted portion 66 may be located between the targeted portion 64 and the sidewalls 14. In such embodiments, the underlying structure 20 is completely covered by the portions of the layer 60.

As noted above, for selectively removing a portion of the layer 60, the ratio of the etch rate of one portion to the etch rate of the other portion may be in the range of about five to about eight relative a same etch process.

In exemplary embodiments, a titanium portion 66 may be selectively removed while a titanium nitride portion 64 remains, such as by a wet etch process selective to removing titanium over titanium nitride.

As a result of processing of operations S202 to S230 of method 200 (FIG. 9), and as shown in FIGS. 10-18, the device 100 at the stage of processing in FIG. 18 is prepared for the formation of a conductive structure 70, such as a conductive plug, in the cavity 12 and electrically connected with the underlying structure 20. With the elimination of the layer 60 from the sidewalls 14 above the portion 64, the aspect ratio of the cavity 12 is reduced to facilitate full deposition of a conductive material within the cavity 12 while avoiding or reducing formation of voids therein.

Further, metal residue 28 that is located on the sidewalls 14 of the cavity 12 may be removed through the processing of operations S208 to S230 of method 200 (FIG. 9).

The method 200 continues with process P240 for forming a conductive structure, such as a conductive plug, in the cavity, over the layer 60, and in electrical connection with the underlying structure 20.

Figure 19:
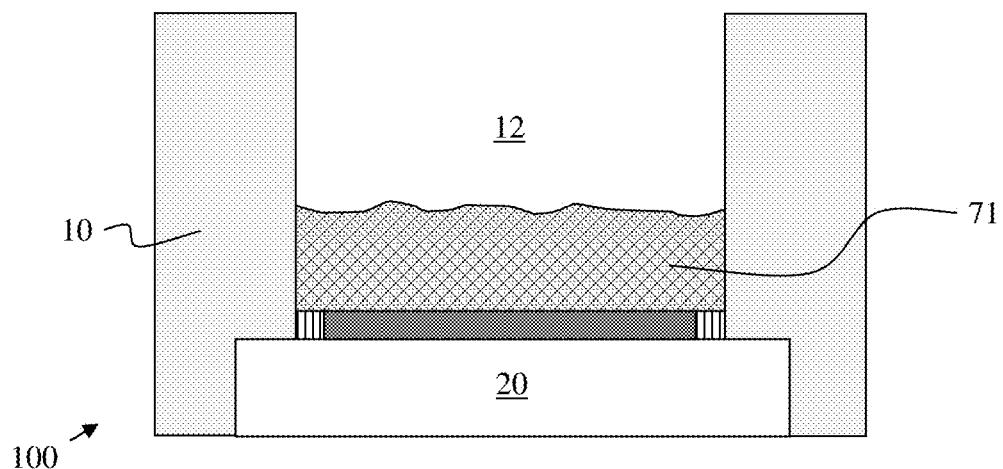

In process P240, operation S242 includes partially filling the cavity 12 with conductive material 76, as shown in FIG. 19. In an exemplary embodiment, the conductive material 76 is tungsten. Further, in an exemplary embodiment, operation S242 includes performing a fluorine free tungsten (FFW) deposition process to partially fill the cavity 12.

Figure 20:
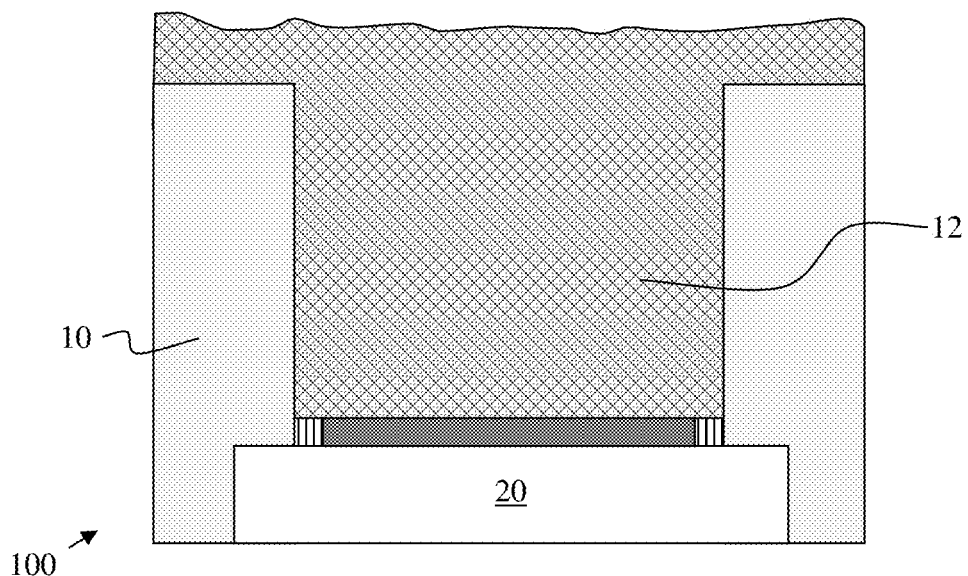

Process P240 continues with operation S244, which includes completely filling the remainder of the cavity 12 with conductive material 77, as shown in FIG. 20. In an exemplary embodiment, the conductive material 77 is tungsten. Further, in an exemplary embodiment, operation S242 includes performing a surface treatment process using hydrogen ($H_2$) gas to generate hydrogen radicals. The precursor, which can include tungsten (W)-containing material such as, for example, tungsten hexafluoride (WF6), can react with the hydrogen radicals to selectively form the conductive material 77.

As shown in FIG. 20, the conductive material 72 may be deposited to overfill the cavity 12 such an overburden portion of the conductive material 72 extends above the cavity 12 and over the top surface 18 of the dielectric material 10.

Figure 21:
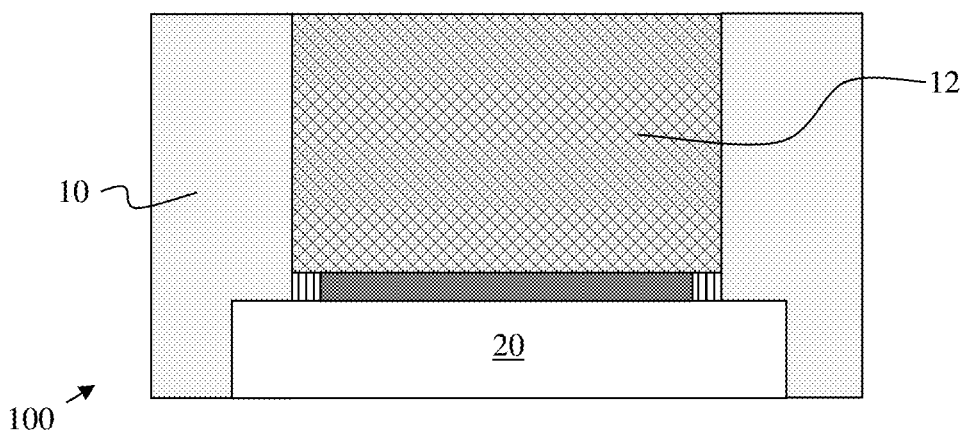

Thereafter, process P240 may include operation S246 in which the structure of device 100 is planarized to remove the overburden portion of the conductive material 72. Thus, conductive structure 70 is formed in the cavity 12 from conductive materials 76 and 77, as shown in FIG. 21.

Method 200 may continue at operation S250 with performing further processing to complete the semiconductor device 100. In certain embodiments, the conductive structure may encompass an underlying structure 20 over which another conductive structure may be formed. For such embodiments, the method 200 may be repeated.

Method 200 of FIG. 9 illustrates one embodiment of a method, or certain features of an embodiment of a method, in conjunction with FIGS. 10-21

Figure 22:
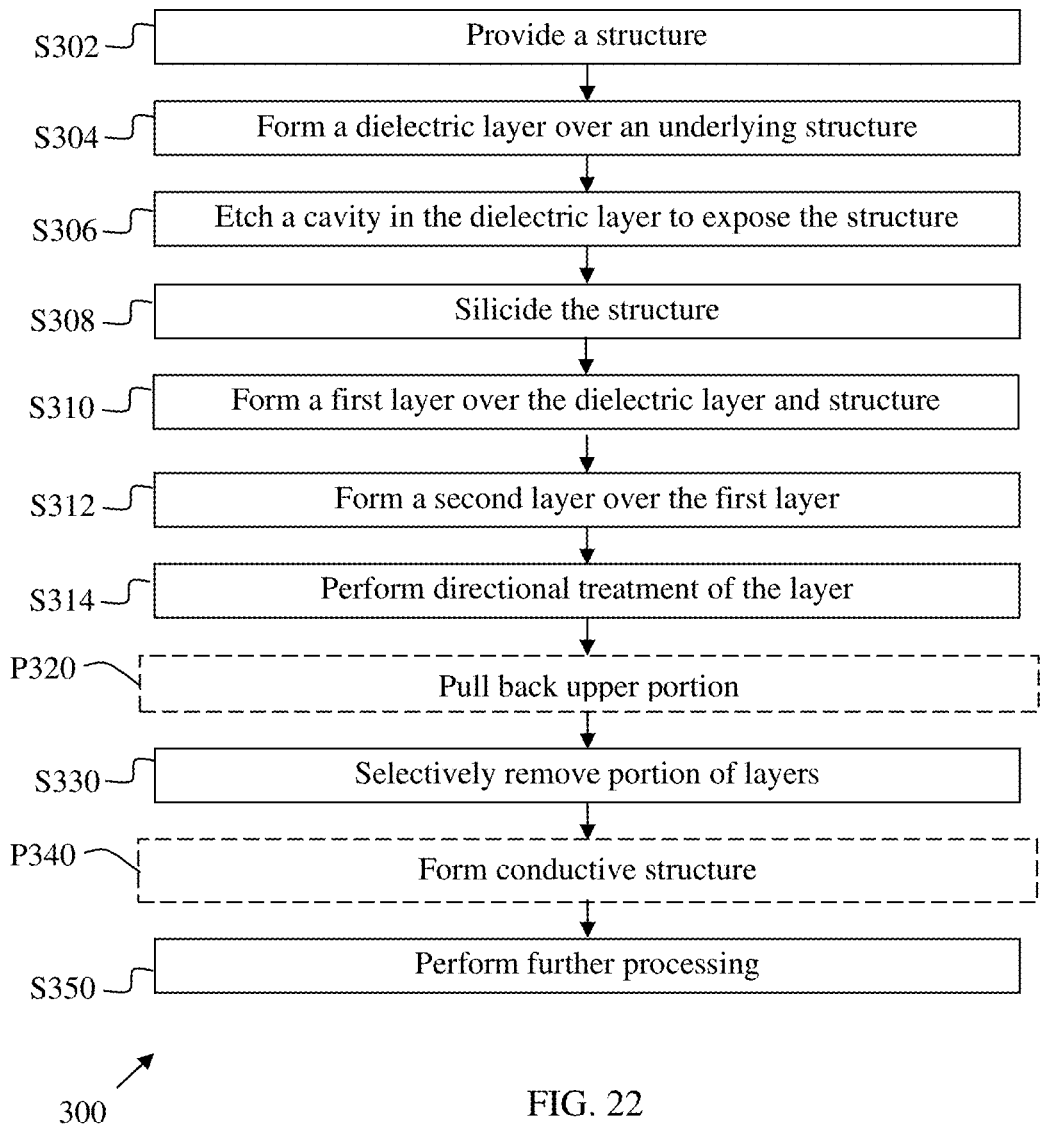
FIG. 22 is a flow chart illustrating a method for forming the structure of FIG. 4 in accordance with some embodiments.
Figure 23A:
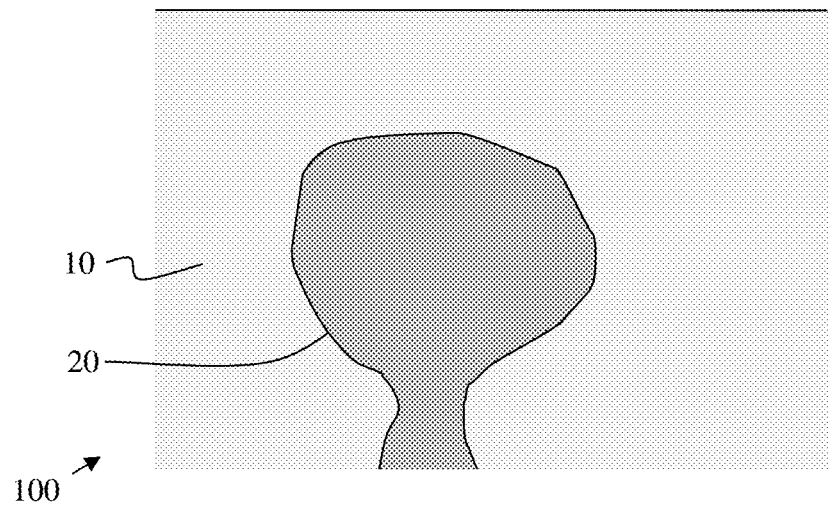
Figure 23B:
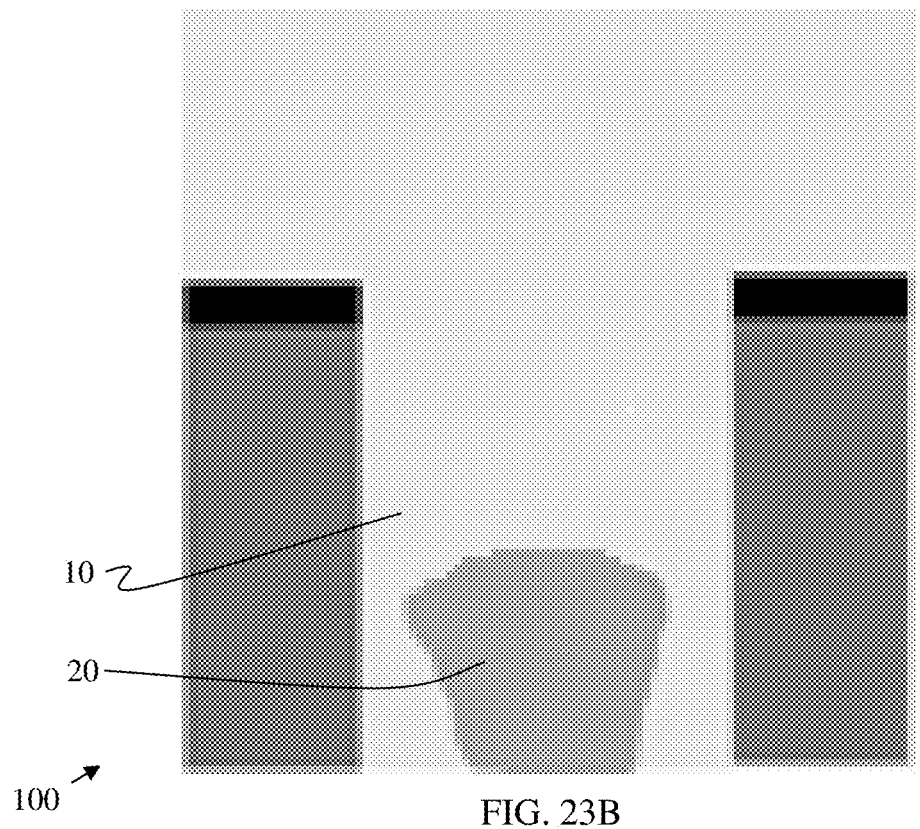

Method 300 of FIG. 22 describes another embodiment of a method, or certain features of an embodiment of a method, in conjunction with FIGS. 23A and 23B through 29A and 29B. FIG. 23A is a Y-directional cross section and FIG. 23B is an X-directional cross section. These views are continued for each A and B figure through FIGS. 29A and 29B.

At operation S302, the method 300 (FIG. 22) provides a structure 20, as shown in FIGS. 23A and B. In some embodiments, the structure 20 is a conductive structure like source/drain region, and specifically an epitaxial source/drain region, as shown. In other embodiments, the structure 20 may be a conductive gate, such as a polysilicon gate. As method 300 provides for siliciding the structure 20, suitable structures 20 include those on which silicide layers may be formed.

At operation S304, the method 300 forms a dielectric material 10 over the structure as shown in FIGS. 23A and B. In exemplary embodiments, the structure 20 is completely covered by the dielectric material 10.

Figure 24A:
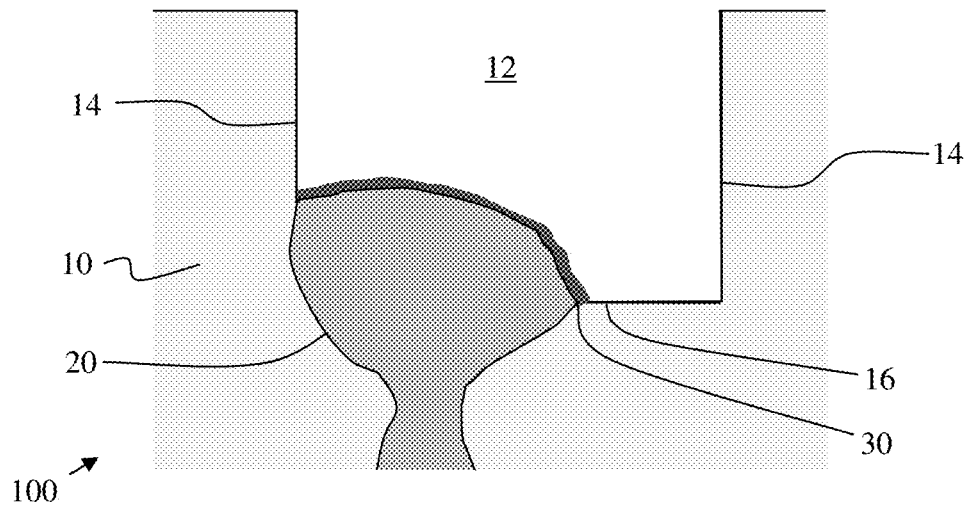
Figure 24B:
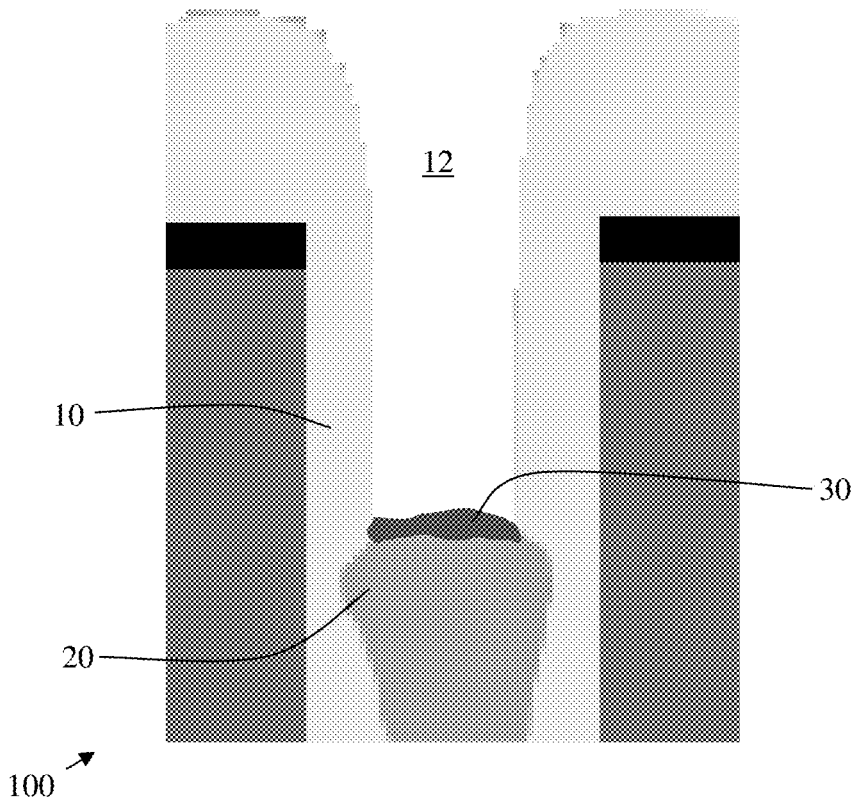

At operation S306, the method 300 includes etching a cavity 12, or contact opening, into the dielectric material 10, as shown in FIGS. 24A and B, to expose the structure For example, typical photolithography techniques may be used, including depositing and patterning a mask over the dielectric material 10 before the dielectric material 10 is etched. The sidewalls 14 formed by the formation of the cavity 12 may be vertical or inclined. For example, the sidewalls 14 may be parallel to the vertical Z-axis that is perpendicular to the X-axis and Y-axis, i.e., the sidewalls 14 form an internal angle of 0° with the vertical Z-axis. Alternatively, the sidewalls 14 may be inclined such that the width of the cavity increases when moving upward from the cavity bottom 16. Such sidewalls 14 may form an internal angle of less than 45° with the vertical Z-axis, such as less than 30° with the vertical Z-axis, less than 20° with the vertical Z-axis, less than 15° with the vertical Z-axis, less than 10° with the vertical Z-axis, or less than 5° with the vertical Z-axis.

As shown in FIGS. 24A and B, the etch process lands on the structure 20. For example, a cavity bottom 16 may be formed partially by dielectric material 10 and partially formed by the structure 20.

The method 300 may continue with operation S308 which includes siliciding the structure 20 to form a layer of silicide 30. For example, a layer of metal is sputter deposited over the surface of the structure 20. An exemplary metal is titanium, cobalt, nickel, tantalum, or the like. A rapid thermal anneal (RTA) technique is performed. The metal layer overlying the structure 20 is transformed by the rapid thermal anneal to a silicide layer 30, for example titanium silicide (TiSi) or cobalt silicide (CoSi). The unreacted metal overlying the dielectric material is removed, as shown in FIGS. 24A and B. The silicide layer 30 may provide an excellent conductive interface at the surface of the structure 20.

Figure 25A:
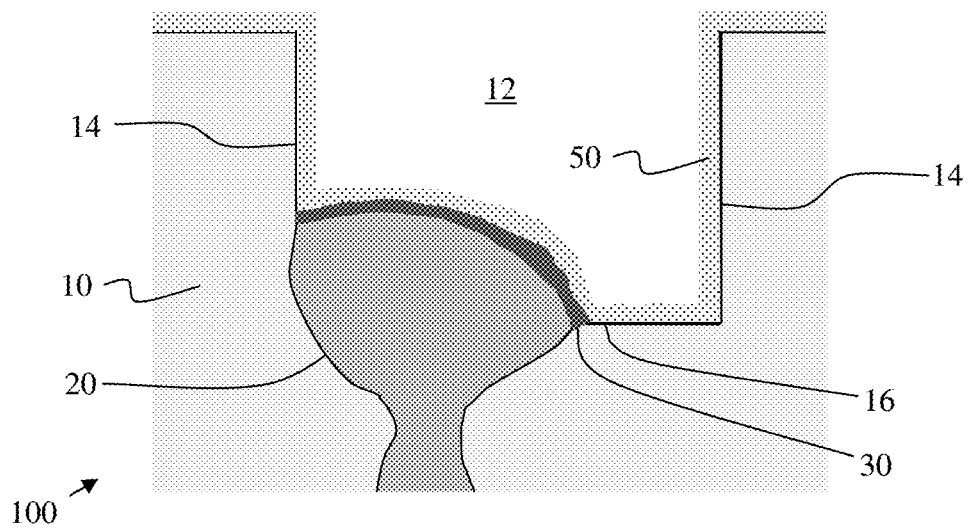
Figure 25B:
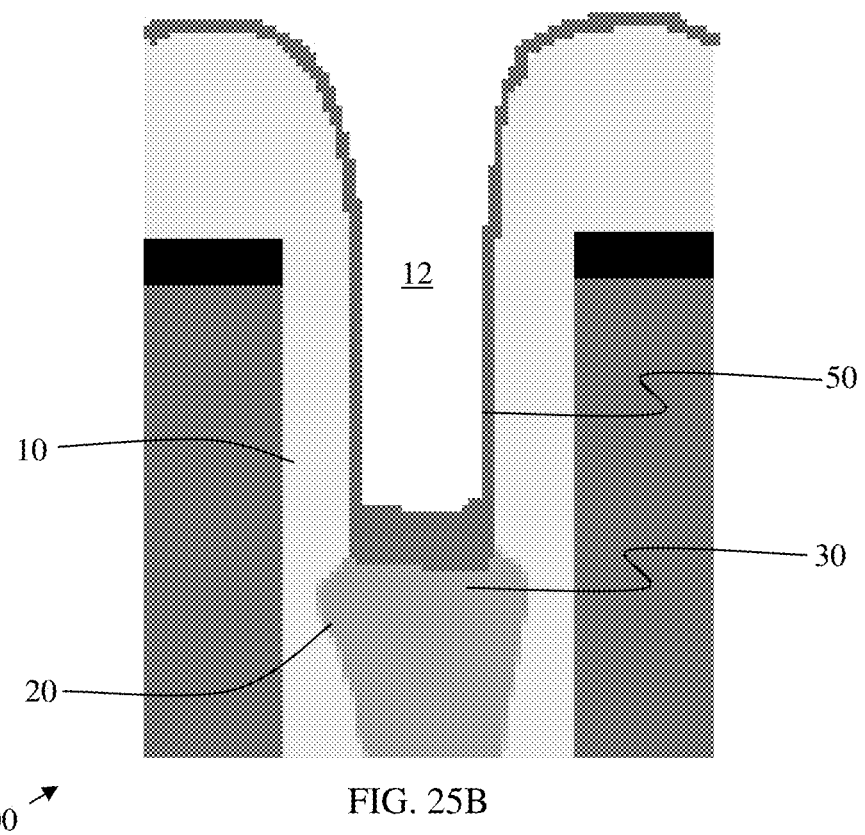

The method 300 may continue with operation S310 which includes forming a first layer 50 over the dielectric material 10 and the structure 20, as shown in FIGS. 25A and B. An exemplary embodiment forms the first layer 50 conformally over the cavity sidewall 14 and the cavity bottom 16. Layer 50 may be deposited by chemical vapor deposition (CVD), physical vapor deposition (PVD), or other suitable process. In an exemplary embodiment, the first layer 50 is a barrier layer, such as a metal barrier layer. For example, the first layer 50 may be a titanium silicon nitride (TiSiN).

Figure 26A:
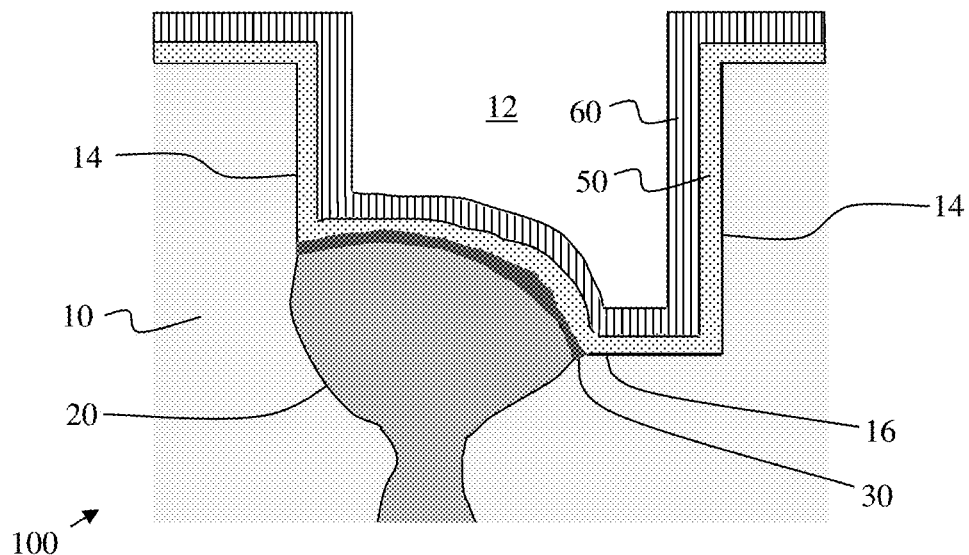
Figure 26B:
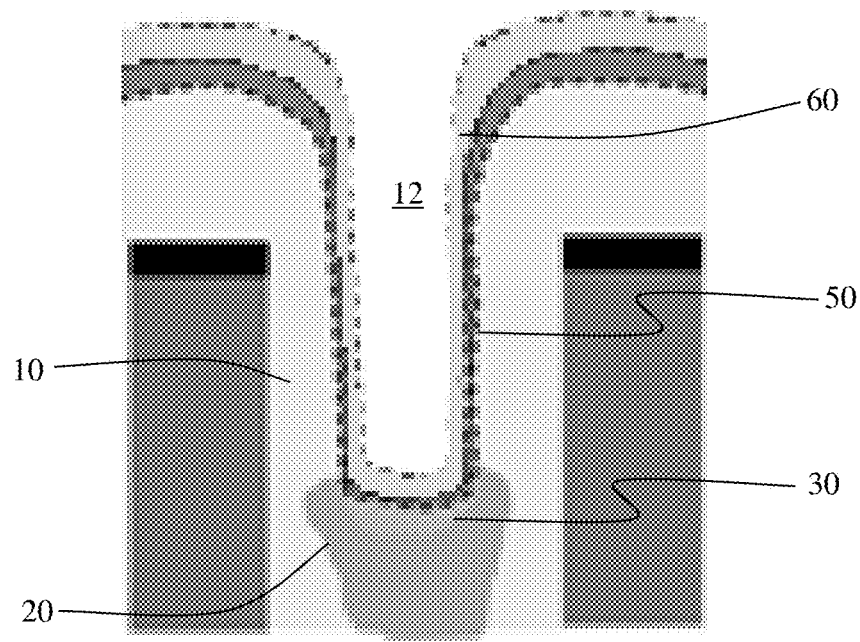

The method 300 may continue with operation S312 which includes forming a second layer 60, in the form of a treatable layer, over the first layer 50 and over the dielectric material 10 and the structure 20, as shown in FIGS. 26A and B. An exemplary embodiment forms the layer 60 conformally.

In exemplary embodiments, the layer 60 is directionally deposited, such that the layer 60 is formed with a greater thickness on the horizontal surfaces, i.e., the layer 60 has a greater thickness on the first layer 50 over the top surface 18 of the dielectric material 10 and on the first layer 50 over cavity bottom 16 formed by the structure 20, as compared to the layer 60 formed on the first layer 50 adjacent to the non-horizontal sidewalls 14.

In an exemplary embodiment, the directional deposition process is a directional metal deposition process. In such embodiments, the layer is metal. In an exemplary embodiment, the layer is titanium.

The directional deposition process may be a plasma deposition process controlled by variables including metal target, flow rate, time, pressure and plasma type.

In an exemplary embodiment, the directional deposition process is a plasma reaction type, the plasma type is direct plasma, the target is titanium (though tungsten, cobalt and other suitable target metals may be used depending on the desired layer material), the process temperature is at about 250° C., the plasma power is from 100 to 5000 W (for ICP or CCP Plasma), and the pressure is from 500 to 30,000 mtorr. Other process conditions are contemplated.

Figure 27A:
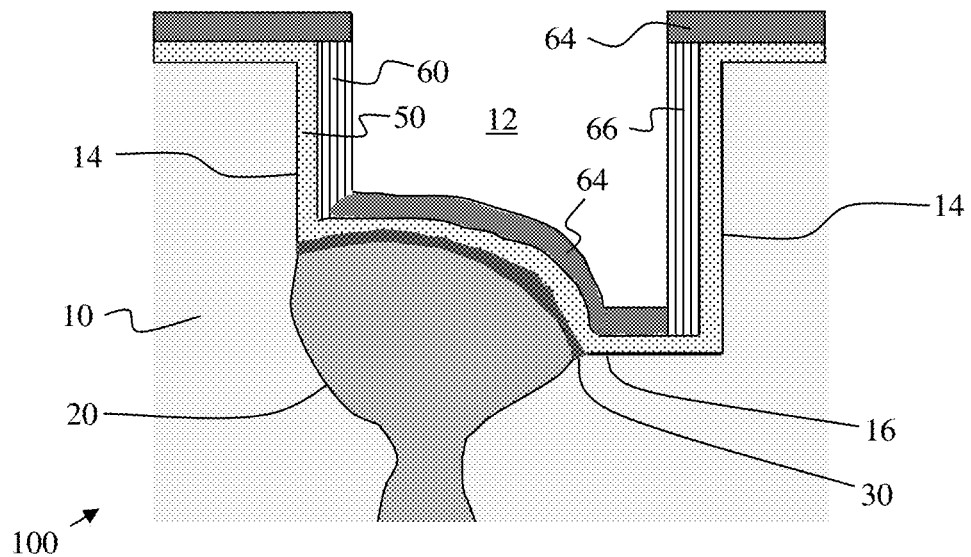
Figure 27B:
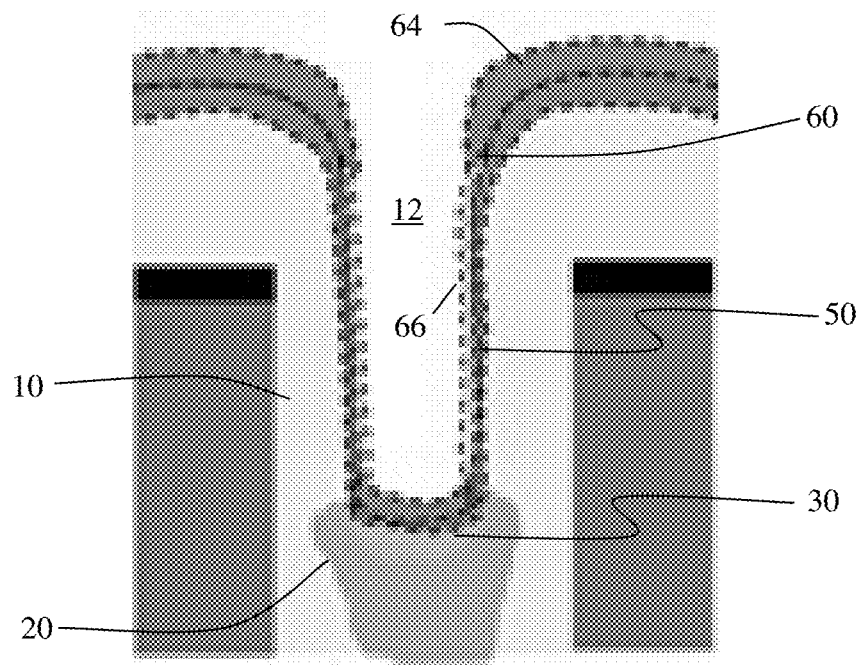
Figure 28A:
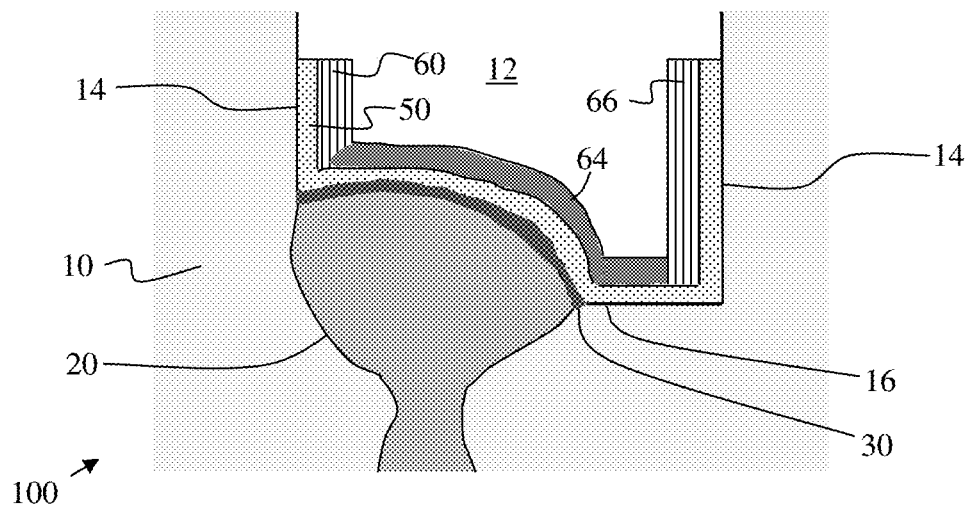
Figure 28B:
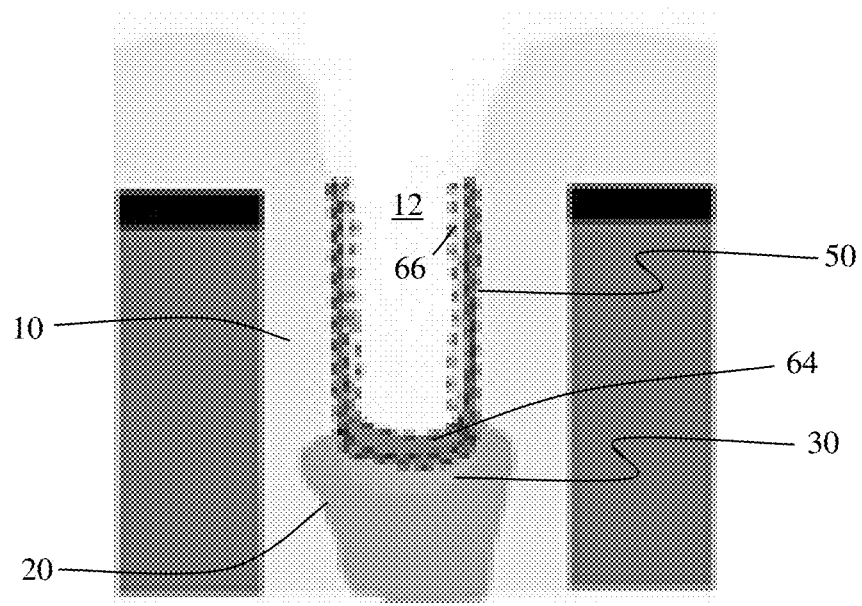

The method 300 may continue with operation S314 which includes performing a directional treatment process on the layer 60, as shown in FIGS. 27A and B. In exemplary embodiments, the directional treatment process converts the material of a targeted portion 64 of the layer 60 to a different material, while a non-targeted portion 66 of the layer 60 remains the same material. More specifically, the directional treatment process causes there to be an intrinsic difference between the materials of the targeted portion 64 and the non-targeted portion 66 such that one or the other may be selectively etched or otherwise removed.

In an exemplary embodiment, the directional treatment is nitridation, such as by a nitrogen plasma process. In other embodiments, the directional treatment comprises an oxidation, chlorination, carbonization, or other suitable process.

In an exemplary embodiment, the layer 60 as initially formed comprises titanium, the directional process is nitridation, the targeted portion 64 is converted to titanium nitride, and the non-targeted portion remains titanium.

The directional treatment may be controlled by variables including flow rate, time, and pressure.

In an exemplary embodiment, the directional treatment process is performed with a reaction chemical $N_2$, $NH_3$, or $N_2H_4$, the inert chemical (carrier gas) is argon, the chemical flow rate is from 50 to 1000 sccm, the process temperature is from ambient (about 20° C.) to about 500° C., the reaction type is thermal (without plasma) or plasma, the plasma power, if used, is from 100 to 5000 W (for ICP or CCP Plasma), and the pressure is from 500 to 30,000 mtorr. Other process conditions are contemplated.

The directional treatment process may be used to enable a selective etch process to remove the non-targeted portion 66 of the layer 60 while the targeted portion 64 of the layer is not removed. For example, a ratio of the etch rate of non-targeted portion 66 to the etch rate of targeted portion 64 may be in the range of about five to about eight relative a same etch process.

As described below, the non-targeted portion 66 is removed. However, embodiments in which the directional treatment process is used to enable a selective etch process to remove the targeted portion 64 of the layer 60 while the non-targeted portion 66 of the layer is not removed. For example, a ratio of the etch rate of targeted portion 64 to the etch rate of non-targeted portion 66 may be in the range of about five to about eight relative a same etch process.

As shown in FIGS. 27A and B, at the illustrated stage of fabrication, a portion 64 of the layer 60 lies over, and directly on, the first layer 50 on the cavity bottom 16, a portion 66 of the layer 60 lies over, and directly on, the first layer 50 on the cavity sidewall 14. Further, it is noted that layers 50 and 60 may be considered to form layer 40

The method 300 may continue with a process P320 for pulling back an upper portion of the layer 40 before the selective removal is performed.

The process P320 is performed in the same manner as the process P220 of FIG. 9, with the additional etching of the layer 50 during the removal of the exposed portion of layer 40 in operation S226. As a result, the stage of fabrication illustrated in FIGS. 28A and B is obtained.

With process P320 completed, the method 300 continues with operation S330 which includes selectively removing a portion of the layers 50 and 60. For example, operation S330 may selectively remove the non-targeted portion or the targeted portion from the structure, wherein the targeted portion or the non-targeted portion remains over the structure.

Figure 29A:
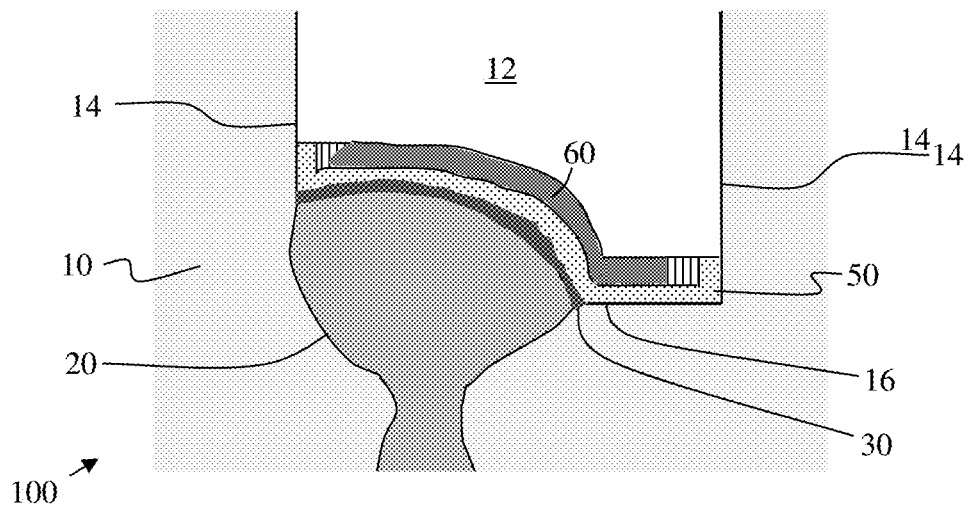
Figure 29B:
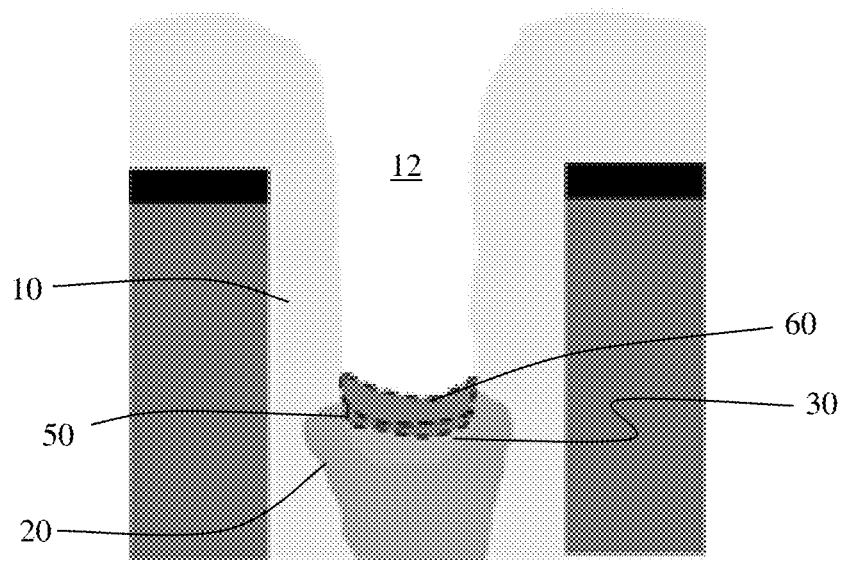

In the illustrated embodiment, operation S330 selectively removes the non-targeted portion 66 of the layer 60, as shown in FIGS. 29A and B. In certain embodiments, only the targeted portion 64 of the layer 60 remains.

As noted above, for selectively removing a portion of the layer 60, the ratio of the etch rate of one portion to the etch rate of the other portion may be in the range of about five to about eight relative a same etch process.

Likewise, the portion of the layer 50 may be selectively removed at heights above the targeted portion 64 of the layer 60.

For selectively removing a portion of the layer 50, the ratio of the etch rate of layer to the etch rate of portion 64 may be in the range of about five to about eight relative a same etch process.

In exemplary embodiments, a titanium portion 66 may be selectively removed while a titanium nitride portion 64 remains, such as by a conformal wet etch.

In an exemplary embodiment, a single wet etchant, such as HCl, $H_2SO_4$, $DIO_3$, or $H_2O_2$, is used to remove the sidewall metal film 66, such as Ti or TSN.

As a result of processing of operations S302 to S330 of method 300 (FIG. 22), and as shown in FIGS. 23A and B through 29A and B, the device 100 at the stage of processing in FIGS. 29A and B is prepared for the formation of a conductive structure 70, such as a conductive plug, in the cavity 12 and electrically connected with the underlying structure 20. With the elimination of the layers 50 and 60 from the sidewalls 14 above the portion 64, the aspect ratio of the cavity 12 is reduced to facilitate full deposition of a conductive material within the cavity 12 while avoiding or reducing formation of voids therein.

The method 300 continues with process P340 for forming a conductive structure, such as a conductive plug, in the cavity, over the layers 50 and 60, and in electrical connection with the underlying structure 20.

Figure 30A:
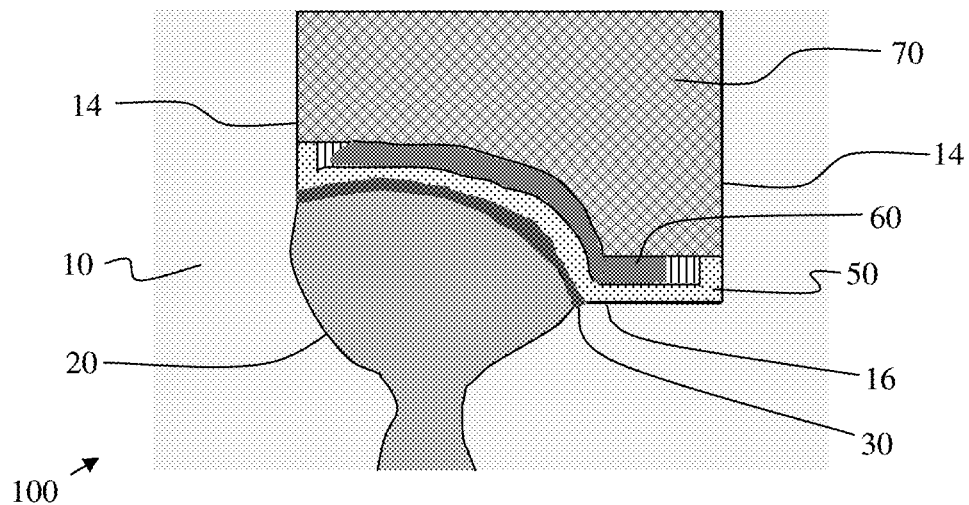
Figure 30B:
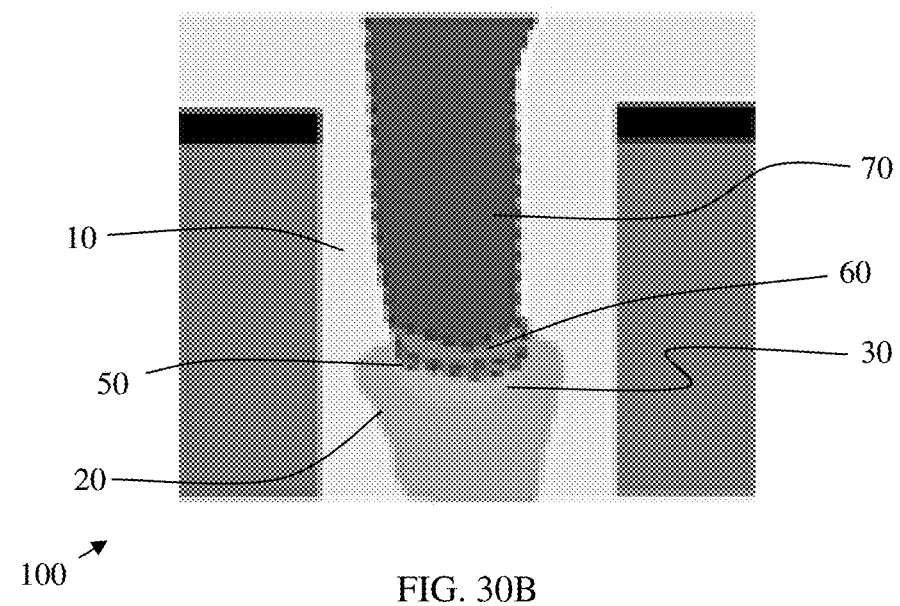

The process P340 is performed in the same manner as the process P240 of FIG. 9. As a result, the stage of fabrication illustrated in FIGS. 30A and B is obtained.

Method 300 may continue at operation S350 with performing further processing to complete the semiconductor device 100. In certain embodiments, the conductive structure may encompass an underlying structure 20 over which another conductive structure may be formed. For such embodiments, the method 200 may be performed as operation S350.

Figure 31:
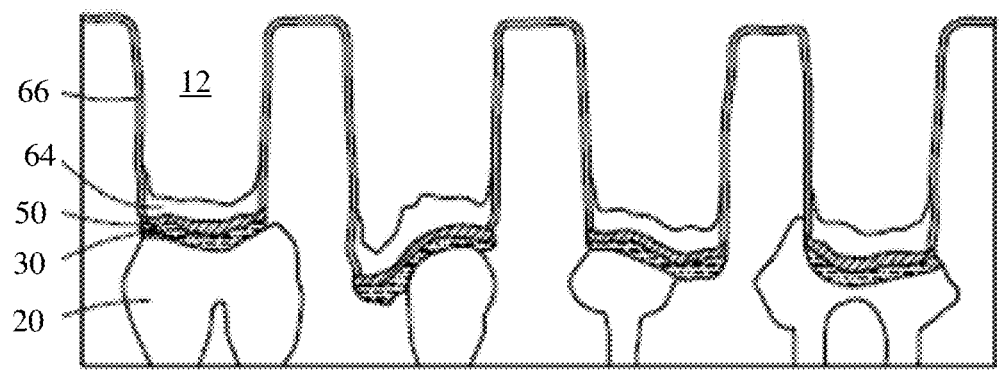
FIG. 31 is a cross-sectional view, similar to FIG. 27, illustrating a plurality of underlying structures having different shapes in accordance with some embodiments.

Referring now to FIG. 31, another embodiment of a source/drain region 21 is illustrated. Specifically, FIG. 31 illustrates a stage of fabrication similar to FIG. 27A, after directional treatment creates targeted region 64 and before non-targeted region 66 is removed. As shown, four underlying structures 20 are formed adjacent one another and have different shapes. In exemplary embodiments, the underlying structures are epitaxial source/drain regions. As shown, a silicide layer 30 is formed on each source/drain region. A first layer such as a metal barrier layer is formed over the silicide layer 30.

In embodiments herein, the layer or layers adjacent to the cavity sidewalls are removed from the cavity, and the cavity is widened as compared to processes in which such layers remain on the cavity sidewalls. Thus, the filling of the cavity by the one or more conductive materials to form the conductive structure or plug may be more easily performed. Specifically, the aspect ratio of the cavity is reduced, and the formation of voids in the conductive structure is avoided or reduced. As such, performance of the conductive structure may be improved.

A method is provided in accordance with some embodiments. The method includes forming a treatable layer over a structure by depositing a layer comprising a metal over a structure; performing a directional treatment process on a targeted portion of the treatable layer to convert the targeted portion to a material different from a non-targeted portion of the treatable layer, wherein the directional treatment process is selected from the group consisting of nitridation, oxidation, chlorination, carbonization; and selectively removing the non-targeted portion from the structure, wherein the targeted portion remains over the structure.

In certain embodiments of the method, forming the treatable layer include depositing a layer including titanium.

In certain embodiments of the method, the structure includes a cavity sidewall and a cavity bottom, and forming the treatable layer over the structure includes forming the treatable layer conformally over the cavity sidewall and the cavity bottom. Further, in certain embodiments, a bottom portion of the treatable layer lies over the cavity bottom; a sidewall portion of the treatable layer lies over the cavity sidewall; the bottom portion of the treatable layer is the targeted portion; the sidewall portion of the treatable layer is the non-targeted portion; the method selectively removes the non-targeted portion; and the targeted portion remains over the structure. In certain embodiments, the method further includes forming a conductive plug over the targeted portion.

In certain embodiments, the structure includes an epitaxial region; a silicide layer on the epitaxial region; and a barrier metal layer on the silicide layer; and the treatable layer is formed over the barrier metal layer.

In exemplary embodiments, the structure includes an active region, a source/drain region, a conductive gate, or a conductive plug.

A method is provided in accordance with other embodiments and includes etching a cavity landing on a conductive structure, wherein the cavity is defined by a sidewall; forming a first material over the conductive structure and the sidewall, wherein a bottom portion of the first material is located over the conductive structure, and wherein a side portion of the first material is located adjacent the sidewall; converting the bottom portion to a second material different from the first material; and selectively removing the side portion.

In certain embodiments, the method further includes forming a conductive plug in the cavity over the bottom portion located on the conductive structure.

In certain embodiments of the method, forming the first material over the conductive structure and the sidewall includes directionally depositing the first material, and a thickness of the bottom portion of the first material is greater than a thickness of the side portion of the first material.

In certain embodiments of the method, the conductive structure includes a conductive gate. or a conductive plug.

In certain embodiments of the method, etching the material to form the cavity landing on the conductive structure causes residue from the conductive structure to be located on the sidewall; and selectively removing the side portion also removes the residue from the sidewall.

In certain embodiments of the method, the bottom portion of the first material is located directly on the conductive structure, and a side portion of the first material is located directly on the sidewall.

A structure is provided in accordance with some embodiments. The structure includes a cavity delineated by sidewalls of a dielectric material; a conductive structure bordering a bottom of the cavity; a layer or layers of material in the cavity and located directly on the conductive structure and directly on the sidewalls of the dielectric material, wherein the layer or layers of material include a barrier metal; and a conductive plug in the cavity and located directly on the layer or layers of material and directly on the sidewalls of the dielectric material.

In certain embodiments of the structure, the layer or layers of material separate the conductive structure from the conductive plug by an average minimum thickness (T); and a height (H) of the layer or layers of material in contact with the sidewalls is less than five times the average minimum thickness (H<5T).

In certain embodiments of the structure, an interface is defined where the conductive structure, the layer or layers of material, and a selected sidewall are in contact; a contact edge of the conductive plug is in contact with the sidewall; and a minimum distance between the conductive plug and the interface is located from the contact edge of the conductive plug to the interface.

In certain embodiments of the structure, the conductive structure is a silicided epitaxial region; the layer or layers of material are a TiSiN layer and a TiN layer; and the conductive plug is tungsten.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present.

What is claimed is:

1. A method, comprising:
   forming a treatable layer by depositing a layer comprising a metal over a structure;
   performing a directional treatment process on a targeted portion of the treatable layer to convert the targeted portion to a material different from a non-targeted portion of the treatable layer, wherein the directional treatment process is selected from the group consisting of nitridation, oxidation, chlorination, carbonization; and after performing the directional treatment process on the targeted portion of the treatable layer, selectively removing the non-targeted portion from the structure, wherein the targeted portion remains over the structure.

2. The method of claim 1, wherein the layer comprising a metal is a metal layer.

3. The method of claim 1, further comprising forming a conductive plug over the targeted portion after performing the directional treatment process on the targeted portion of the treatable layer.

4. The method of claim 1, wherein:
   the structure includes a cavity sidewall and a cavity bottom;
   forming the treatable layer over the structure comprises forming the treatable layer conformally over the cavity sidewall and the cavity bottom;
   a bottom portion of the treatable layer lies over the cavity bottom;
   a sidewall portion of the treatable layer lies over the cavity sidewall;
   the bottom portion is located between the cavity bottom and the sidewall portion of the treatable layer;
   the bottom portion of the treatable layer is the targeted portion; and
   the sidewall portion of the treatable layer is the non-targeted portion.

5. The method of claim 4, further comprising forming a conductive plug over the targeted portion.

6. The method of claim 1, wherein the structure comprises:
   an epitaxial region;
   a silicide layer on the epitaxial region; and
   a barrier metal layer on the silicide layer; wherein the treatable layer is formed over the barrier metal layer.

7. The method of claim 1, wherein the structure comprises an active region.

8. The method of claim 1, wherein the structure comprises a source/drain region.

9. The method of claim 1, performing the directional treatment process on the targeted portion of the treatable layer comprises performing a nitridation process.

10. The method of claim 1, performing the directional treatment process on the targeted portion of the treatable layer comprises performing an oxidation process.

11. The method of claim 1, performing the directional treatment process on the targeted portion of the treatable layer comprises performing a chlorination process.

12. The method of claim 1, performing the directional treatment process on the targeted portion of the treatable layer comprises performing a carbonization process.

13. A method, comprising:
   etching a cavity landing on a conductive structure, wherein the cavity is defined by a sidewall, and wherein etching the cavity landing on the conductive structure causes residue from the conductive structure to be located on the sidewall;
   forming a first material over the conductive structure and the sidewall, wherein a bottom portion of the first material is located over the conductive structure, and wherein a side portion of the first material is located adjacent the sidewall;
   converting the bottom portion to a second material different from the first material; and
   selectively removing the side portion and the residue from the sidewall.

14. The method of claim 13, further comprising forming a conductive plug in the cavity over the bottom portion located on the conductive structure.

15. The method of claim 13, wherein forming the first material over the conductive structure and the sidewall comprises directionally depositing the first material, and wherein a thickness of the bottom portion of the first material is greater than a thickness of the side portion of the first material.

16. The method of claim 13, wherein the bottom portion of the first material is located directly on the conductive structure, and wherein a side portion of the first material is located directly on the sidewall.

17. The method of claim 13, further comprising forming the conductive structure surrounded by a dielectric material, wherein etching the cavity landing on the conductive structure comprises etching the conductive structure and the dielectric material, wherein the sidewall is formed by the dielectric material, and wherein the cavity is defined by a cavity bottom formed by an upper surface of the conductive structure and an upper surface of the dielectric material.

18. A method, comprising:
forming a treatable layer by depositing a layer consisting of metal over a structure;
performing a directional treatment process on a targeted portion of the treatable layer to convert the targeted portion to a material different from a non-targeted portion of the treatable layer, wherein the directional treatment process is selected from the group consisting of nitridation, oxidation, chlorination, carbonization; and
selectively removing the non-targeted portion from the structure, wherein the targeted portion remains over the structure.

19. The method of claim 18, further comprising forming a conductive plug over the targeted portion after performing the directional treatment process on the targeted portion of the treatable layer.

20. The method of claim 18, wherein
the structure includes a cavity sidewall and a cavity bottom;
forming the treatable layer over the structure comprises forming the treatable layer conformally over the cavity sidewall and the cavity bottom;
a bottom portion of the treatable layer lies over the cavity bottom;
a sidewall portion of the treatable layer lies over the cavity sidewall;
the bottom portion is located between the cavity bottom and the sidewall portion of the treatable layer;
the bottom portion of the treatable layer is the targeted portion; and
the sidewall portion of the treatable layer is the non-targeted portion.

* * * * *